US012777637B2

(12) United States Patent
Lim et al.

(10) Patent No.: US 12,777,637 B2
(45) Date of Patent: Oct. 27, 2026

(54) SEMICONDUCTOR DEVICE

(71) Applicant: SAMSUNG ELECTRONICS CO., LTD., Suwon-si (KR)

(72) Inventors: Dongkyun Lim, Suwon-si (KR); Soobin Kim, Suwon-si (KR); Seungyoung Seo, Suwon-si (KR); Sunwoo Heo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 246 days.

(21) Appl. No.: 18/653,191

(22) Filed: May 2, 2024

(65) Prior Publication Data

US 2025/0056794 A1 Feb. 13, 2025

(30) Foreign Application Priority Data

Aug. 11, 2023 (KR) ........................ 10-2023-0105673

(51) Int. Cl.

*H10B 12/00* (2023.01)
*H10W 20/41* (2026.01)
*H10W 20/42* (2026.01)

(52) U.S. Cl.

CPC ........... *H10B 12/50* (2023.02); *H10B 12/315* (2023.02); *H10B 12/482* (2023.02); *H10B 12/488* (2023.02); *H10W 20/42* (2026.01); *H10W 20/435* (2026.01)

(58) Field of Classification Search

CPC ....... H10B 12/50; H10B 12/09; H10W 20/42; H10W 20/435

See application file for complete search history.

(56) References Cited

U.S. PATENT DOCUMENTS

| | | | |
|---|---|---|---|
| 6,204,191 B1 | 3/2001 | Jung et al. | |
| 6,287,971 B1 | 9/2001 | Park et al. | |
| 10,804,277 B2 | 10/2020 | Kim et al. | |
| 2021/0225767 A1* | 7/2021 | Lee ..................... | H10W 20/056 |

FOREIGN PATENT DOCUMENTS

| | | |
|---|---|---|
| KR | 10-0278654 | 2/2001 |
| KR | 10-0290835 | 7/2001 |
| KR | 10-0764336 | 10/2007 |
| KR | 10-0924208 | 10/2009 |
| KR | 10-2010-0022348 | 3/2010 |
| KR | 10-2489949 | 1/2023 |

* cited by examiner

*Primary Examiner* — Douglas M Menz

(74) *Attorney, Agent, or Firm* — Fish & Richardson P.C.

(57) ABSTRACT

A semiconductor device includes a substrate including a cell region and a peripheral circuit region, a peripheral circuit gate line on the peripheral circuit region of the substrate, an interlayer insulating layer surrounding the peripheral circuit gate line, a contact plug passing through the interlayer insulating layer to be connected to the substrate, a wiring pad on the contact plug, and a metal via being in contact with the wiring pad, wherein a first sidewall and a second sidewall of the contact plug form acute angles with an upper surface of the contact plug, and a first sidewall and a second sidewall of the wiring pad form acute angles with a lower surface of the wiring pad.

20 Claims, 28 Drawing Sheets

1

SEMICONDUCTOR DEVICE

CROSS-REFERENCE TO RELATED APPLICATION

This application claims priority from Korean Patent Application No. 10-2023-0105673, filed in the Korean Intellectual Property Office on Aug. 11, 2023, the disclosure of which is incorporated by reference herein in its entirety.

BACKGROUND

With rapid development of the electronics industry and user demands, electronic devices are being reduced in size and weight. Accordingly, semiconductor devices with a high degree of integration are required to be used in electronic devices, and design rules for configurations of the semiconductor devices are decreasing.

SUMMARY

In general, in some aspects, the present disclosure is directed toward a semiconductor device having improved performance and reliability.

According to some aspects of the present disclosure, a semiconductor device includes a substrate including a cell region and a peripheral circuit region, an active region defined by a device isolation layer in the cell region of the substrate, a word line extending in a first horizontal direction across the active region in the cell region of the substrate, a bit line extending in a second horizontal direction intersecting the first horizontal direction in the cell region of the substrate, a peripheral circuit gate line extending in the second horizontal direction on the peripheral circuit region of the substrate, an interlayer insulating layer surrounding the peripheral circuit gate line on the substrate, a contact plug separated in the first horizontal direction from the peripheral circuit gate line in the peripheral circuit region of the substrate and passing through the interlayer insulating layer to be connected to the substrate, a wiring pad in contact with the contact plug on the contact plug and including a recess portion in an upper surface of the wiring pad, and a metal via including a protrusion within the recess portion and an extension portion on the protrusion and being in contact with the wiring pad, wherein a first sidewall and a second sidewall of the contact plug which are opposite to each other form acute angles with an upper surface of the contact plug, a first sidewall and a second sidewall of the wiring pad which are opposite to each other form acute angles with a lower surface of the wiring pad, and a width of the protrusion of the metal via in the first horizontal direction is less than a width of the extension portion in the first horizontal direction.

According to some aspects of the present disclosure, a semiconductor device includes a substrate including a cell region and a peripheral circuit region, an active region defined by a device isolation layer in the cell region of the substrate, a word line extending in a first horizontal direction across the active region in the cell region of the substrate, a plurality of bit line structures extending in a second horizontal direction intersecting the first horizontal direction on the cell region of the substrate, a buried contact being between the plurality of bit line structures and connected to the active region, a landing pad arranged on the buried contact, including a body portion between the plurality of bit line structures and a pad portion on the body portion, and connected to the active region through the buried contact, a peripheral circuit gate line extending in the second horizontal direction on the peripheral circuit region of the substrate, an interlayer insulating layer surrounding the peripheral circuit gate line on the peripheral circuit region of the substrate, a contact plug separated in the first horizontal direction from the peripheral circuit gate line on the peripheral circuit region of the substrate and passing through the interlayer insulating layer to be connected to the substrate, a wiring pad in contact with the contact plug on the contact plug, and a metal via in contact with the wiring pad on the wiring pad, wherein a width of the contact plug in the first horizontal direction decreases as a vertical level of the contact plug lowers, the wiring pad has a trapezoidal cross-section including an upper surface and a lower surface parallel to each other, a first side-wall forming a first angle, which is an acute angle, with the lower surface, and a second side-wall forming a second angle, which is an acute angle, with the lower surface, the metal via includes a portion of which a width in the first horizontal direction decreases as a vertical level of the metal via lowers, and a thickness of the pad portion of the landing pad in a vertical direction is equal to a thickness of the wiring pad in the vertical direction.

According to some aspects of the present disclosure, a semiconductor device includes a substrate including a cell region and a peripheral circuit region, an active region defined by a device isolation layer in the cell region of the substrate, a word line extending in a first horizontal direction across the active region in the cell region of the substrate, a plurality of bit line structures extending in a second horizontal direction intersecting the first horizontal direction on the cell region of the substrate, a buried contact being between the plurality of bit line structures and connected to the active region, a landing pad arranged on the buried contact, including a body portion between the plurality of bit line structures and a pad portion on the body portion, and connected to the active region through the buried contact, a peripheral circuit gate line extending in the second horizontal direction on the peripheral circuit region of the substrate, an interlayer insulating layer surrounding the peripheral circuit gate line on the substrate, a contact plug separated in the first horizontal direction from the peripheral circuit gate line in the peripheral circuit region of the substrate, including titanium nitride that fills a contact plug hole penetrating the interlayer insulating layer, and connected to the substrate, a wiring pad being in contact with the contact plug on the contact plug, including a material different from a material of the contact plug, and including a recess portion in an upper surface of the wiring pad, an upper insulating layer on the wiring pad, and a metal via extending through the upper insulating layer into the recess portion and being in contact with the wiring pad, wherein a first sidewall and a second side-wall of the pad portion of the landing pad which are opposite to each other form acute angles with a lower surface of the pad portion, a first sidewall and a second sidewall of the contact plug which are opposite to each other form acute angles with an upper surface of the contact plug, a first sidewall and a second sidewall of the wiring pad which are opposite to each other form acute angles with a lower surface of the wiring pad, a width of the metal via in the first horizontal direction decreases as a vertical level of the metal via lowers, a thickness of the pad portion of the landing pad in a vertical direction is equal to a thickness of the wiring pad in the vertical direction, and a length of the metal via in the vertical direction is 10 μm or greater.

BRIEF DESCRIPTION OF THE DRAWINGS

Exemplary implementations will be more clearly understood from the following detailed description, taken in conjunction with the accompanying drawings.

DETAILED DESCRIPTION

Hereinafter, exemplary implementations will be described in detail with reference to the accompanying drawings.

Figure 1:
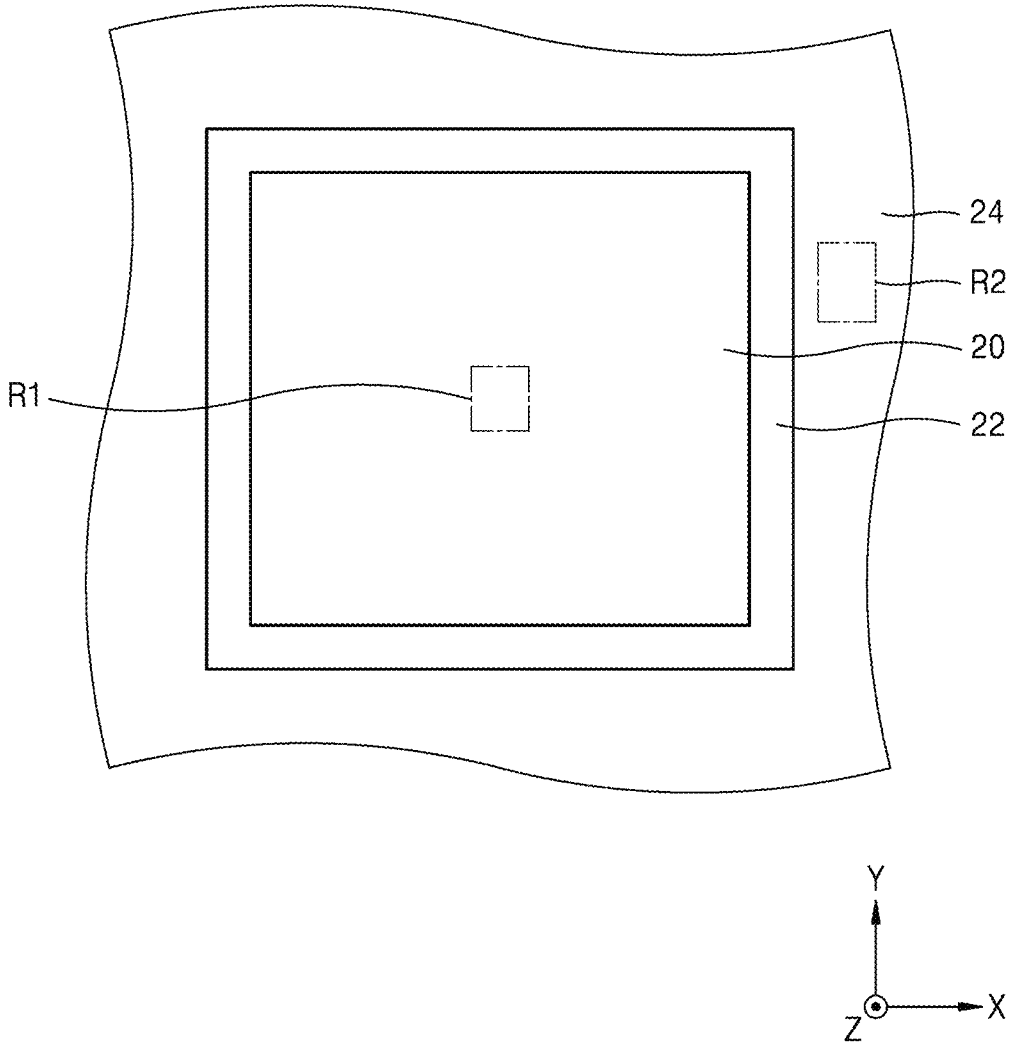
FIG. 1 is a schematic layout diagram of an exemplary semiconductor device according to some implementations.

FIG. 1 is a schematic layout diagram of an exemplary semiconductor device according to some implementations. In FIG. 1, a semiconductor device may include a cell region 20, a connection region 22, and a peripheral circuit region 24, with the connection region 22 being formed along a perimeter of the cell region 20. The connection region 22 may be between the cell region 20 and the peripheral circuit region 24, and may separate the cell region 20 from the peripheral circuit region 24. The peripheral circuit region 24 may be defined around the cell region 20.

Figure 2:
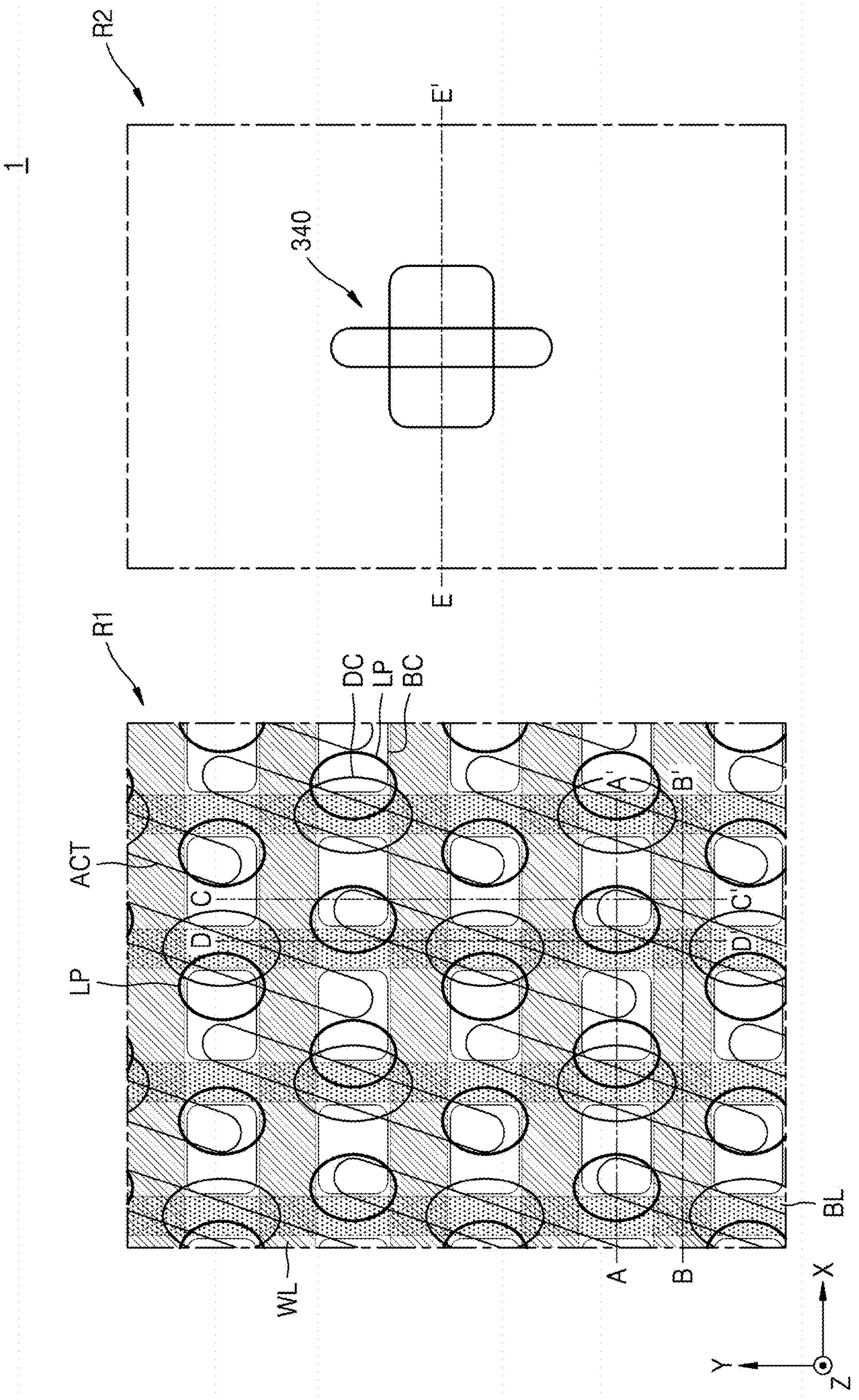
FIG. 2 illustrates schematic layout diagrams of exemplary regions R1 and R2 of FIG. 1 according to some implementations.

FIG. 2 illustrates schematic layout diagrams of an exemplary region R1 and an exemplary region R2 of FIG. 1 according to some implementations, and FIGS. 3A to 3D are cross-sectional views taken along line A-A', line B-B', line C-C', and line D-D' of FIG. 2 according to some implementations. In FIG. 2, a semiconductor device 1 may include a plurality of active regions ACT. In some implementations, the plurality of active regions ACT may each have a long axis in a diagonal direction with respect to a first horizontal direction (the X direction) and a second horizontal direction (the Y direction). The plurality of active regions ACT may constitute a plurality of first active regions 118, as illustrated in FIGS. 3A to 3D. A plurality of word lines WL may extend parallel to each other in the first horizontal direction (the X direction) across the plurality of active regions ACT. On the plurality of word lines WL, a plurality of bit lines BL may extend parallel to each other in the second horizontal direction (the Y direction) intersecting the first horizontal direction (the X direction).

In some implementations, a plurality of buried contacts BC may each be between two of the plurality of bit lines BL. In some implementations, the plurality of buried contacts BC may be arranged in a row in each of the first horizontal direction (the X direction) and the second horizontal direction (the Y direction).

In FIG. 2, a plurality of landing pads LP may be on the plurality of buried contacts BC. At least a part of each of the plurality of landing pads LP may overlap each of the plurality of buried contacts BC. In some implementations, the plurality of landing pads LP may each extend to an upper portion of one of the two adjacent bit lines BL. In some implementations, a plurality of storage nodes may be on the plurality of landing pads LP. In some implementations, the plurality of storage nodes may be on the plurality of bit lines BL. The plurality of storage nodes may be lower electrodes of a plurality of capacitors, and may be connected to the plurality of active regions ACT through the plurality of landing pads LP and the plurality of buried contacts BC.

In some implementations, the semiconductor device 1 may be a dynamic random access memory (DRAM) device.

In FIGS. 3A to 3D, the semiconductor device 1 includes the plurality of first active regions 118 defined by a device isolation layer 111, a substrate 110 having a plurality of word line trenches 120T crossing the plurality of first active regions 118, a plurality of word lines 120 in the plurality of word line trenches 120T, a plurality of bit line structures 140, and a plurality of capacitor structures 200 including a plurality of lower electrodes 210, a capacitor dielectric layer 220, and an upper electrode 230. The substrate 110 may include, for example, silicon (Si), crystalline Si, polycrystalline Si, or amorphous Si. In some implementations, the substrate 110 may include a semiconductor element, such as germanium (Ge), or at least one compound semiconductor selected from silicon germanium (SiGe), silicon carbide (SiC), gallium arsenide (GaAs), indium arsenide (InAs), and indium phosphide (InP). In some implementations, the substrate 110 may have a silicon-on-insulator (SOI) structure. For example, the substrate 110 may include a buried oxide layer (BOX) layer and may include a conductive region, such as a well doped with impurities, or a structure doped with impurities.

Figure 3A:
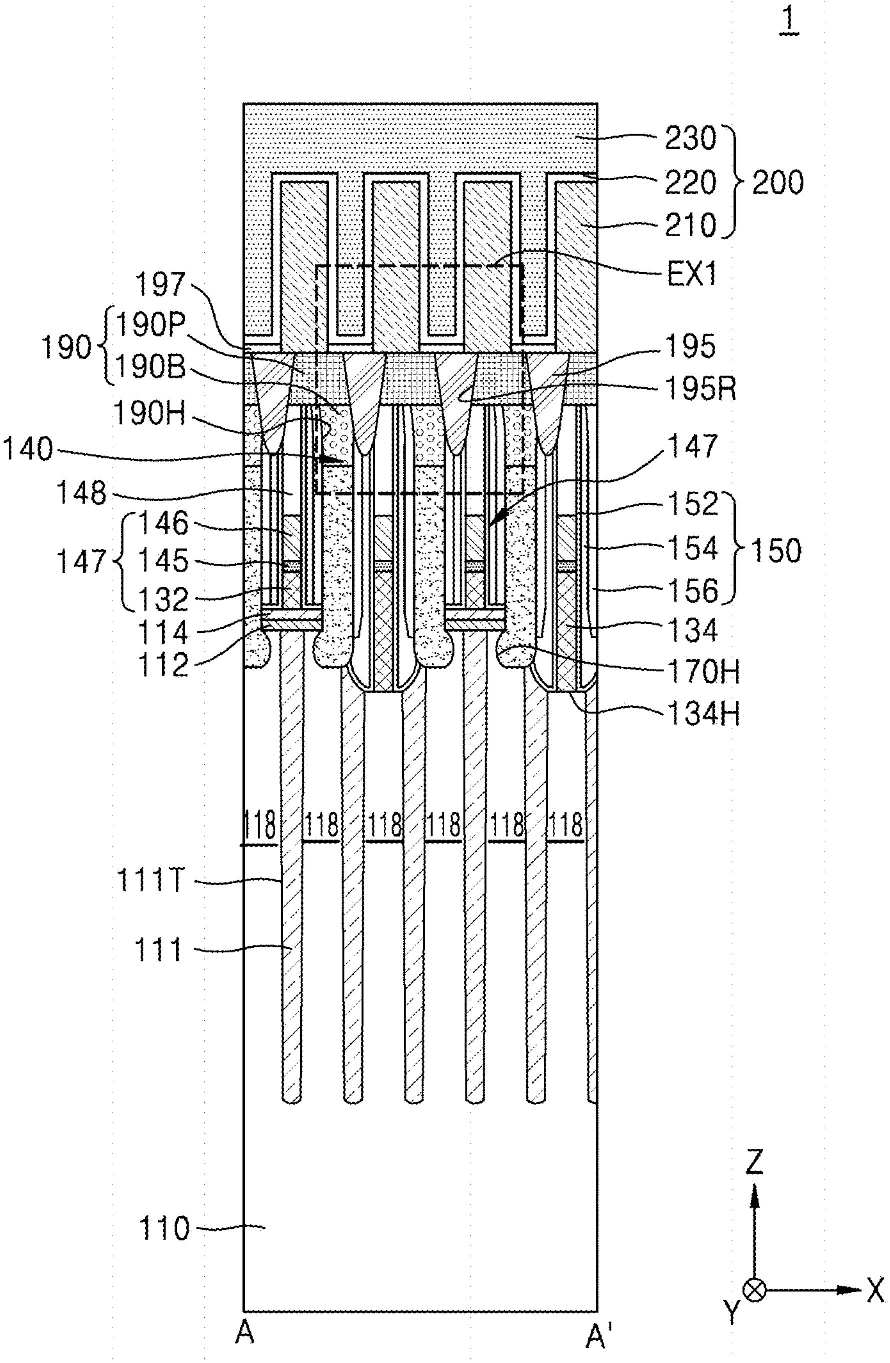
FIGS. 3A to 3D are cross-sectional views taken along line A-A', line B-B', line C-C', and line D-D' of FIG. 2 according to some implementations.

In FIG. 3A, the plurality of first active regions 118 may be a part of the substrate 110 defined by the device isolation trench 111T, and may each have a relatively long island shape having a short axis and a long axis in plan view. In some implementations, the plurality of first active regions 118 may each have a long axis in a diagonal direction with respect to the first horizontal direction (the X direction) and the second horizontal direction (the Y direction). The plurality of first active regions 118 may extend in the long-axis direction, have substantially the same length as each other, and be repeatedly arranged at a generally constant pitch. Here, the plurality of first active regions 118 may constitute the plurality of active regions ACT, as illustrated in FIG. 2.

Figure 3B:
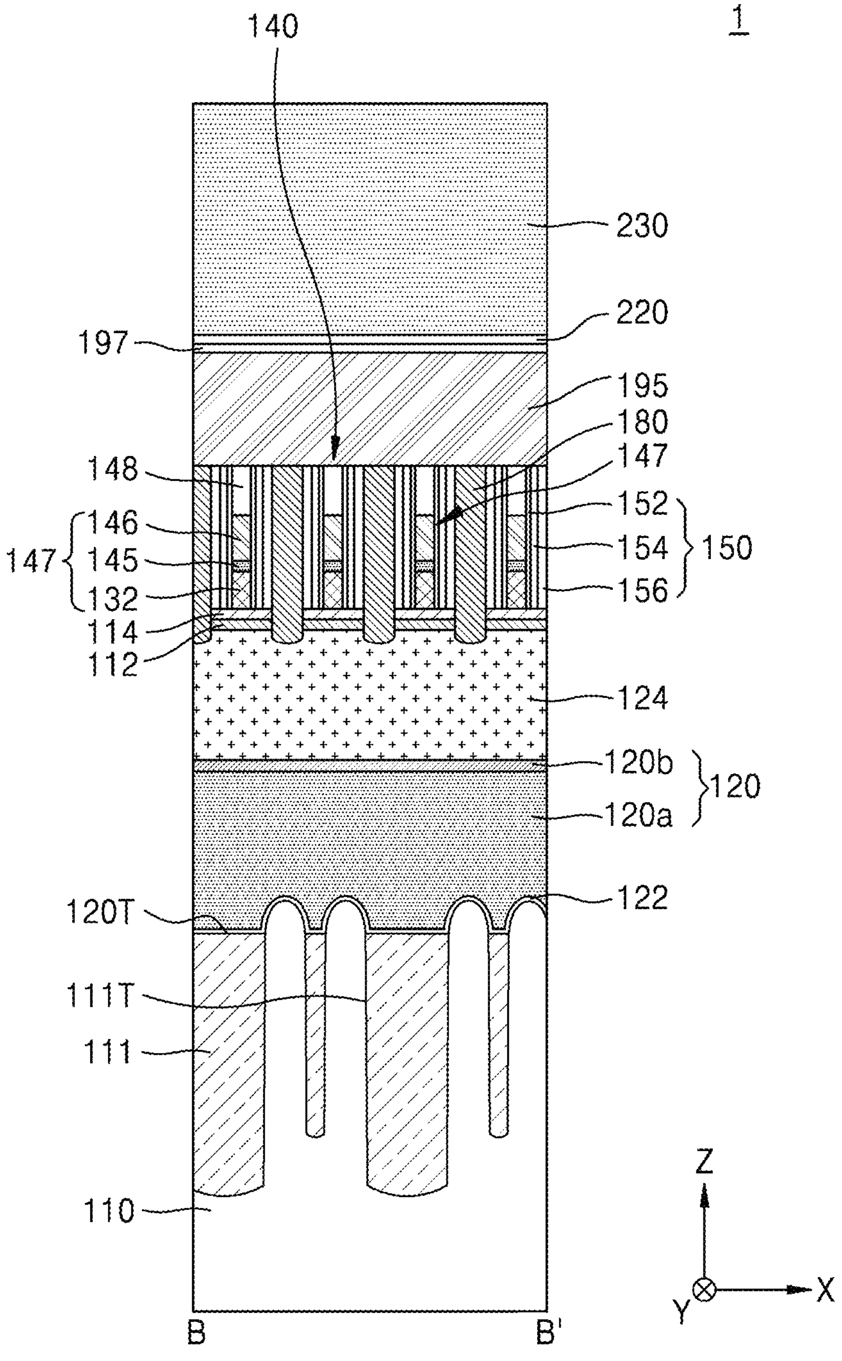
Figure 3C:
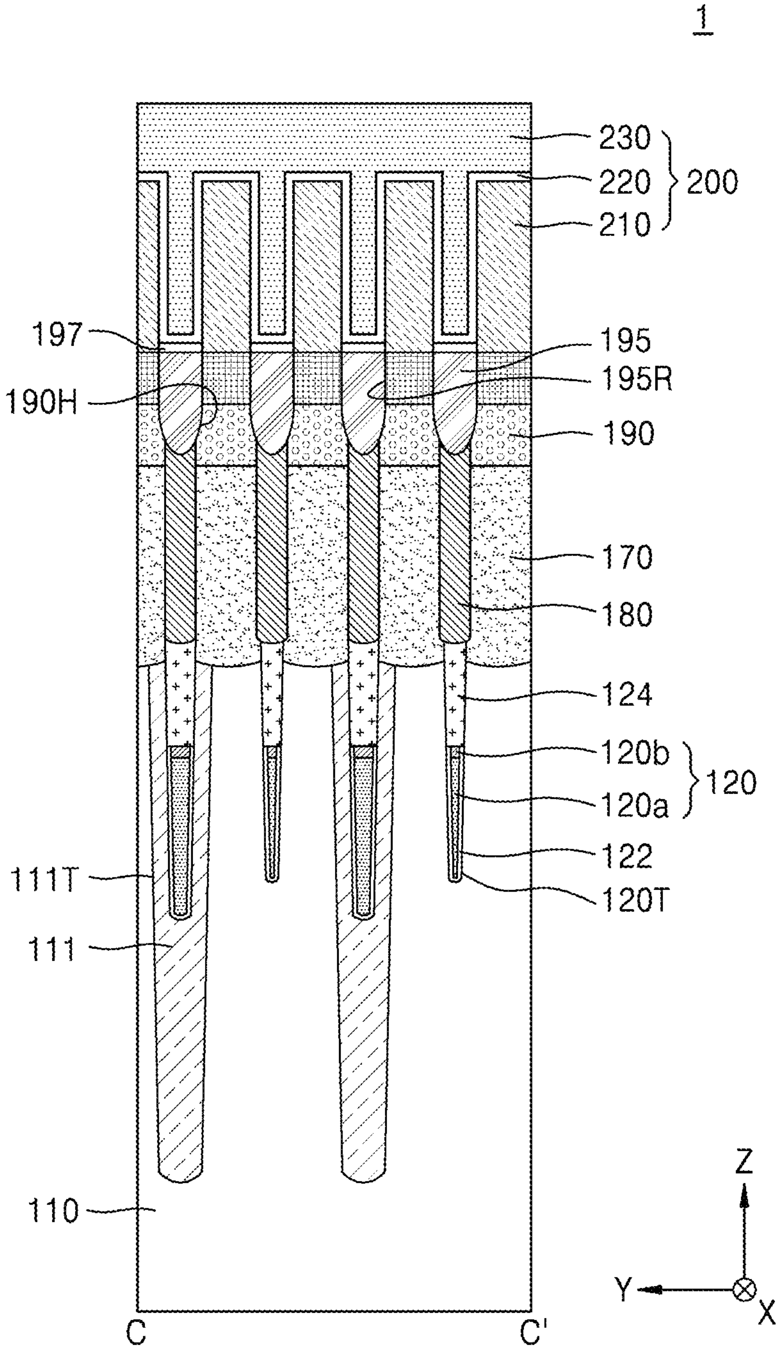

In FIGS. 3A to 3C, the device isolation layer 111 may fill the device isolation trench 111T. The plurality of first active regions 118 may be defined by the device isolation layer 111 on the substrate 110. In some implementations, the device isolation layer 111 may be composed of a triple layer including a first device isolation layer, a second device isolation layer, and a third device isolation layer, but is not limited thereto. For example, the first device isolation layer may conformally cover an inner side surface and a bottom surface of the device isolation trench 111T. In some implementations, the first device isolation layer may be formed of silicon oxide. For example, the second device isolation layer may conformally cover the first device isolation layer. In some implementations, the second device isolation layer may be formed of silicon nitride. For example, the third device isolation layer may cover the second device isolation layer and fill the device isolation trench 111T. In some implementations, the third device isolation layer may be formed of silicon oxide. For example, the third device isolation layer may be formed of silicon oxide including tonen silazene (TOSZ). In some implementations, the device isolation layer 111 may be a single layer composed of one type of insulating layer, a double-layer composed of two types of insulating layers, or a multi-layer composed of a combination of at least four types of insulating layers. For example, the device isolation layer 111 may be composed of a single layer formed of silicon oxide.

In FIGS. 3B and 3C, the plurality of word line trenches 120T may be formed in the substrate 110 including the plurality of first active regions 118 defined by the device isolation layer 111. The plurality of word line trenches 120T may have line shapes that extend parallel to each other in the first horizontal direction (the X direction) across the plurality of first active regions 118 and are arranged at substantially equal intervals in the second horizontal direction (the Y direction). In some implementations, step differences may be formed on the bottom surfaces of the plurality of word line trenches 120T.

A plurality of gate dielectric layers 122, a plurality of word lines 120, and a plurality of dummy buried insulating layers 124 may be sequentially formed inside the plurality of word line trenches 120T. The plurality of word lines 120 may constitute the plurality of word lines WL, as illustrated in FIG. 2. The plurality of word lines 120 may have line shapes that extend parallel to each other in the first horizontal direction (the X direction) across the plurality of first active regions 118 and are arranged at substantially equal intervals in the second horizontal direction (the Y direction). Upper surfaces of the plurality of word lines 120 may be at a vertical level lower than an upper surface of the substrate 110. Bottom surfaces of the plurality of word lines 120 may each have an uneven shape, and in some implementations saddle fin-shaped transistors (saddle FinFETs) may be formed in the plurality of first active regions 118.

In some implementations, the plurality of word lines 120 may partially fill lower portions of the plurality of word line trenches 120T, and may each have a stacked structure of a lower word line layer 120*a* and an upper word line layer 120*b*. For example, the gate dielectric layer 122 may be between the lower word line layer 120*a* and device isolation layer 111, and the lower word line layer 120*a* may conformally cover an inner side-wall and a bottom surface of a part of a lower side of the word line trench 120T. For example, the upper word line layer 120*b* may cover the lower word line layer 120*a*, have the gate dielectric layer 122 therebetween, and fill a part of a lower side of the word line trench 120T. In some implementations, the lower word line layer 120*a* may be formed of a metal material, such as Ti, TiN, Ta, or TaN, or a conductive metal nitride. In some implementations, the upper word line layer 120*b* may be formed of, for example, doped polysilicon, a metal material such as W, a conductive metal nitride, such as WN, TiSiN, WSiN, or a combination thereof.

Figure 3D:
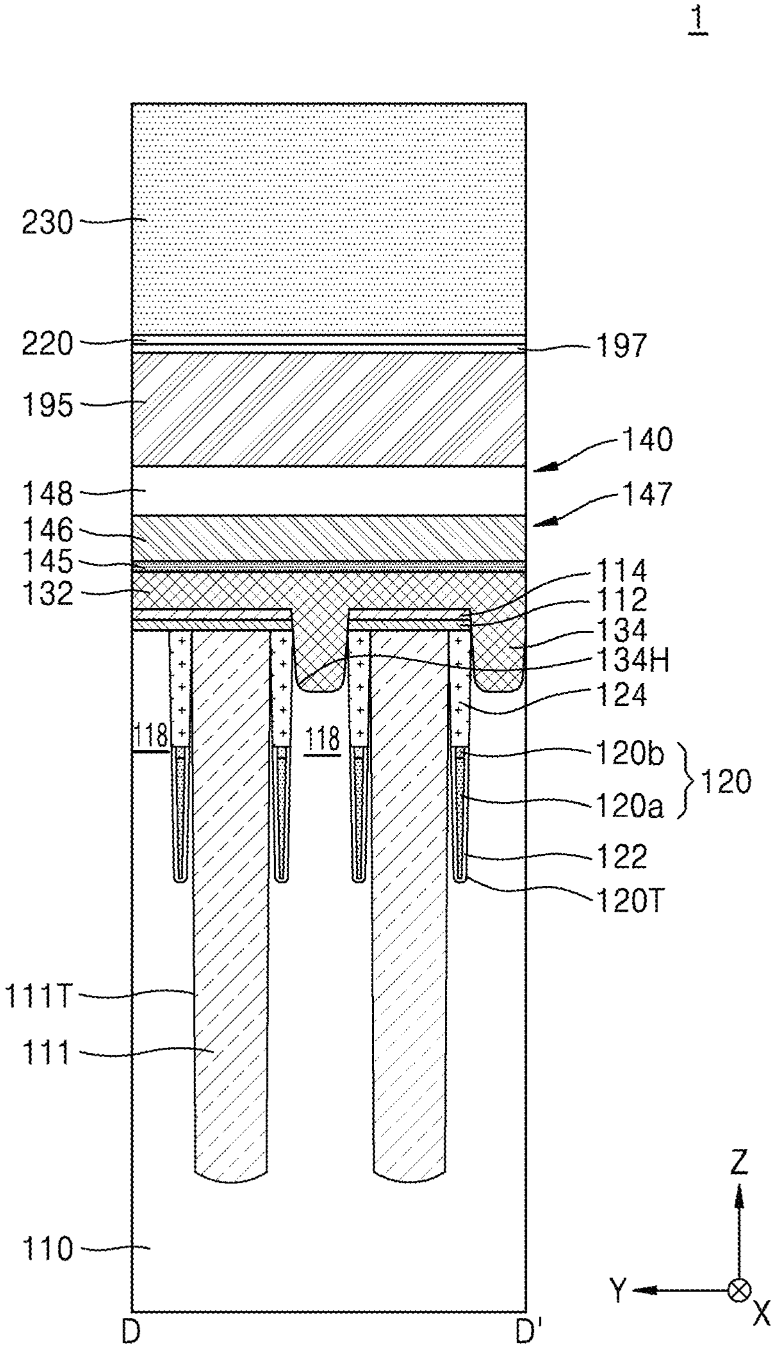

In FIG. 3A, a source region and a drain region formed by injecting impurity ions into the first active region 118 may be in the first active region 118 of the substrate 110 on both sides of each of the plurality of word lines 120. In FIGS. 3B to 3D, the gate dielectric layer 122 may cover an inner side-wall and a bottom surface of the word line trench 120T. In some implementations, the gate dielectric layer 122 may extend from a position between the word line 120 and the word line trench 120T to a position between the dummy buried insulating layer 124 and the word line trench 120T. The gate dielectric layer 122 may be formed of at least one material selected from silicon oxide, silicon nitride, silicon oxynitride, oxide/nitride/oxide (ONO), and a high-k dielectric material with a higher dielectric constant than silicon oxide. For example, the gate dielectric layer 122 may have a dielectric constant of about 10 to about 25. In some implementations, the gate dielectric layer 122 may be formed of at least one material selected from hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO). For example, the gate dielectric layer 122 may be formed of $HfO_2$, $Al_2O_3$, $HfAlO_3$, $Ta_2O_3$, or $TiO_2$.

In FIGS. 3B to 3D, the plurality of dummy buried insulating layers 124 may each fill a part of an upper portion of each the plurality of word line trenches 120T. In some implementations, upper surfaces of the plurality of dummy buried insulating layers 124 may be at substantially the same vertical level as an upper surface of the substrate 110. The dummy buried insulating layer 124 may be formed of at least one material selected from silicon oxide, silicon nitride, silicon oxynitride, and a combination thereof. For example, the dummy buried insulating layer 124 may be formed of silicon nitride.

In FIGS. 3A, 3B, and 3D, the insulating layer patterns 112 and 114 may be on the device isolation layer 111, the plurality of first active regions 118, and the plurality of dummy buried insulating layers 124. For example, the insulating layer patterns 112 and 114 may be formed of silicon oxide, silicon nitride, silicon oxynitride, a metal dielectric material, or a combination thereof. In some implementations, the insulating layer patterns 112 and 114 may have a stacked structure of a plurality of insulating layers including a first insulating layer pattern 112 and a second insulating layer pattern 114. In some implementations, the first insulating layer pattern 112 may be formed of silicon oxide, and the second insulating layer pattern 114 may be formed of silicon oxynitride. In some implementations, the first insulating layer pattern 112 may be formed of a non-metallic dielectric material, and the second insulating layer pattern 114 may be formed of a metallic dielectric material. In some implementations, the second insulating layer pattern 114 may be thicker than the first insulating layer pattern 112. For example, the first insulating layer pattern 112 may have a thickness of about 50 Å to about 90 Å, and the second insulating layer pattern 114 may be thicker than the first insulating layer pattern 112 and may have a thickness of about 60 Å to about 100 Å.

In FIGS. 3A and 3D, each of a plurality of direct contact conductive patterns 134 may fill a part of each of a plurality of direct contact holes 134H that penetrate the insulating layer patterns 112 and 114, and expose source regions in the plurality of first active regions 118. In some implementations, the plurality of direct contact holes 134H may extend into the plurality of first active regions 118, that is, into the source regions. The plurality of direct contact conductive patterns 134 may be formed of, for example, doped polysilicon. In some implementations, the plurality of direct contact conductive patterns 134 may each be composed of an epitaxial silicon layer. The plurality of direct contact conductive patterns 134 may form a plurality of direct contacts DC, as illustrated in FIG. 2.

In FIGS. 3A and 3D, the plurality of bit line structures 140 may be on the insulating layer patterns 112 and 114. The plurality of bit line structures 140 may include a plurality of bit lines 147 and a plurality of insulating capping lines 148 covering the plurality of bit lines 147. The plurality of bit line structures 140 may extend parallel to each other in the second horizontal direction (the Y direction) parallel to a main surface of the substrate 110. The plurality of bit lines 147 may constitute the plurality of bit lines BL, as illustrated in FIG. 2. The plurality of bit lines 147 may be electrically connected to the plurality of first active regions 118 through the plurality of direct contact conductive patterns 134. In some implementations, the plurality of insulating capping lines 148 may be formed of silicon nitride.

In FIGS. 3A, 3B, and 3D, the plurality of bit lines 147 may each have a stacked structure of a first metallic conductive pattern 145 and a second metallic conductive pattern 146, each having a line shape. In some implementations, the first metallic conductive pattern 145 may be formed of titanium nitride (TiN) or TSN (Ti—Si—N), and the second metallic conductive pattern 146 may be formed of tungsten (W) or tungsten silicide (WSix). In some implementations, the first metallic conductive pattern 145 may function as a diffusion barrier.

In some implementations, the plurality of bit lines 147 may each further include a conductive semiconductor pattern 132 placed between the insulating layer patterns 112 and 114 and the metallic conductive patterns 145 and 146. The conductive semiconductor pattern 132 may be formed of, for example, doped polysilicon.

In FIGS. 3A and 3B, a plurality of insulating spacer structures 150 may cover both sidewalls of the plurality of bit line structures 140. The plurality of insulating spacer structures 150 may each include a first insulating spacer 152, a second insulating spacer 154, and a third insulating spacer 156. In some implementations, the plurality of insulating spacer structures 150 may extend into the plurality of direct contact holes 134H and cover both sidewalls of each of the plurality of direct contact conductive patterns 134. The second insulating spacer 154 may be formed of a material with a lower dielectric constant than the first insulating spacer 152 and the third insulating spacer 156. In some implementations, the first insulating spacer 152 and the third insulating spacer 156 may be formed of nitride, and the second insulating spacer 154 may be formed of oxide. In some implementations, the first insulating spacer 152 and the third insulating spacer 156 may be formed of nitride, and the second insulating spacer 154 may be formed of a material with an etch selectivity with respect to the first insulating spacer 152 and the third insulating spacer 156. For example, the first insulating spacer 152 and the third insulating spacer 156 may be formed of nitride, and the second insulating spacer 154 may be an air spacer. In some implementations, the plurality of insulating spacer structures 150 may each include the second insulating spacer 154 formed of oxide and the third insulating spacer 156 formed of nitride.

In FIGS. 3B and 3C, the plurality of insulating fences 180 may each be in a space between a pair of insulating spacer structures 150 facing each other between a pair of adjacent bit line structures 140. The plurality of insulating fences 180 may be arranged in a row and spaced apart from each other between a pair of insulating spacer structures 150 facing each other, that is, in the second horizontal direction (the Y direction). For example, the plurality of insulating fences 180 may be formed of nitride.

In some implementations, the plurality of insulating fences 180 may each extend into the dummy buried insulating layer 124 through the insulating layer patterns 112 and 114 but is not limited thereto. In some other implementations, the plurality of insulating fences 180 may each pass through the insulating layer patterns 112 and 114 without extending into the dummy buried insulating layer 124 or may each extend into the insulating layer patterns 112 and 114 without passing through the insulating layer pattern 112 and 114, or lower surfaces of the plurality of insulating fences 180 may each be in contact with the insulating layer patterns 112 and 114 without extending into the insulating layer patterns 112 and 114.

In FIGS. 3A and 3B, a plurality of buried contact holes 170H may be defined between the plurality of insulating fences 180 and between the plurality of bit lines 147. The plurality of buried contact holes 170H and the plurality of insulating fences 180 may be arranged alternately along a space between a pair of insulating spacer structures 150 facing each other among the plurality of insulating spacer structures 150 covering both side-walls of the plurality of bit line structures 140, that is, in the second horizontal direction (the Y direction). Internal spaces of the plurality of buried contact holes 170H may each be defined by the insulating spacer structure 150 between two adjacent bit lines 147 among the plurality of bit lines 147 and covering sidewalls of the two adjacent bit lines 147, the insulating fence 180 and the first active region 118. In some implementations, the plurality of buried contact holes 170H may each extend from a position between the insulating spacer structure 150 and the insulating fence 180 into the first active region 118.

A plurality of buried contacts 170 may be inside the plurality of buried contact holes 170H. The plurality of buried contacts 170 may fill a part of a lower side of a space between the plurality of insulating fences 180 and the plurality of insulating spacer structures 150 covering both side-walls of the plurality of bit line structures 140. The plurality of buried contacts 170 and the plurality of insulating fences 180 may be arranged alternately in a position between a pair of insulating spacer structures 150 facing each other among the plurality of insulating spacer structures 150 covering both side-walls of the plurality of bit line structures 140, that is, in the second horizontal direction (the Y direction). For example, the plurality of buried contacts 170 may be formed of polysilicon.

In some implementations, the plurality of buried contacts 170 may be arranged in a row in the first horizontal direction (the X direction) and the second horizontal direction (the Y direction). The plurality of buried contacts 170 may each extend from an upper portion of the first active region 118 in a vertical direction (the Z direction) perpendicular to the substrate 110. The plurality of buried contacts 170 may constitute the plurality of buried contacts BC illustrated in FIG. 2.

In FIGS. 3A to 3C, levels of upper surfaces of the plurality of buried contacts 170 may be lower than levels of upper surfaces of the plurality of insulating capping lines 148. Upper surfaces of the plurality of insulating fences 180 may be at the same vertical level as the upper surfaces of the plurality of insulating capping lines 148 in the vertical direction (the Z direction).

In FIGS. 3A and 3C, a plurality of landing pad holes 190H may be defined by the plurality of buried contacts 170, the plurality of insulating spacer structures 150, and the plurality of insulating fences 180. The plurality of buried contacts 170 may be exposed on bottom surfaces of the plurality of landing pad holes 190H.

A plurality of landing pads 190 may each fill at least a part of each of the plurality of landing pad holes 190H and may extend onto the plurality of bit line structures 140. The plurality of landing pads 190 may be separated from each other by a plurality of first recess portions 195R. The plurality of landing pads 190 may respectively include a plurality of body portions 190B and a plurality of pad portion 190P respectively on the plurality of body portions 190B. The plurality of body portions 190B may each be between two of the plurality of bit line structures 140. The plurality of pad portions 190P may be separated from each other by the plurality of first recess portions 195R. The plurality of body portions 190B may include titanium nitride (TiN). The plurality of pad portions 190P include tungsten (W).

In some implementations, the plurality of pad portions 190P may each have a shape of which a width in the first horizontal direction (the X direction) increases as a vertical level of the pad portion 190P lowers. For example, the plurality of pad portions 190P may each have a shape of which a width in the first horizontal direction (the X direction) gradually increases as the vertical level of the pad portion 190P lowers. The shape of each of the plurality of pad portions 190P is described below with reference to FIG. 5.

In some implementations, a plurality of metal silicide layers may be between the plurality of landing pads 190 and the plurality of buried contacts 170. The plurality of metal silicide layers may be formed of cobalt silicide ($CoSi_x$), nickel silicide ($NiSi_x$), or manganese silicide ($MnSi_x$), but is not limited thereto.

In FIG. 3C, the plurality of landing pads 190 may be on the plurality of buried contacts 170, and the plurality of buried contacts 170 and the plurality of landing pads 190 corresponding to each other may be electrically connected to each other. The plurality of landing pads 190 may be respectively connected to the plurality of first active regions 118 through the plurality of buried contacts 170. The plurality of landing pads 190 may respectively constitute the plurality of landing pads LP, as illustrated in FIG. 2. The buried contact 170 may be between two adjacent bit line structures 140, and the landing pad 190 may extend from a position between two adjacent bit line structures 140 onto one bit line structure 140 with the buried contact therebetween.

In FIGS. 3A and 3C, the first recess portion 195R may be filled with the first insulating structure 195. In some implementations, the first insulating structure 195 may include silicon nitride. In some other implementations, the first insulating structure 195 may include an interlayer insulating layer and an etch stop layer. For example, the interlayer insulating layer may be formed of oxide, and the etch stop layer may be formed of nitride. For example, the etch stop layer may be formed of silicon nitride or silicon boron nitride (SiBN).

In some implementations, an upper surface of the first insulating structure 195 may be at the same vertical level as upper surfaces of the plurality of landing pads 190. In some implementations, the first insulating structure 195 may fill the plurality of first recess portions 195R and cover the upper surfaces of the plurality of landing pads 190, thereby having an upper surface at a vertical level higher than the upper surfaces of the plurality of landing pads 190.

In some implementations, the first insulating structure 195 may have a shape of which a width in the first horizontal direction (the X direction) decreases as a vertical level of the first insulating structure 195 lowers. For example, the first insulating structure 195 may have a shape of which a width in the first horizontal direction (the X direction) gradually decreases as the vertical level of the first insulating structure 195 lowers. The shape of the first insulating structure 195 is described below with reference to FIG. 5.

In FIG. 3C, a first upper insulating layer 197 may be on the first insulating structure 195. The first upper insulating layer 197 may be formed of silicon carbonitride. The first upper insulating layer 197 may not be between the landing pad 190 and the lower electrode 210.

In FIGS. 3A and 3C, the plurality of capacitor structures 200 including the plurality of lower electrodes 210, the capacitor dielectric layer 220, and the upper electrode 230 may be on the plurality of landing pads 190 and the first upper insulating layer 197. The lower electrode 210 and the landing pad 190 corresponding to each other may be electrically connected to each other. Additionally, the upper surface of the first insulating structure 195 is at the same vertical level as a lower surface of the lower electrode 210 but is not limited thereto.

In some implementations, the semiconductor device 1 may further include at least one support pattern that is in contact with sidewalls of the plurality of lower electrodes 210 and supports the plurality of lower electrodes 210. The at least one support pattern may be formed of any one of silicon nitride (SiN), silicon carbonitride (SiCN), N-rich silicon nitride (N-rich SiN), and Si-rich silicon nitride layer (Si-rich SiN), but it is not limited thereto. In some implementations, the at least one support pattern may include a plurality of support patterns that are in contact with sidewalls of the plurality of lower electrodes 210 and are at different vertical levels to be separated from each other in the vertical direction (the Z direction).

In FIGS. 3A and 3C, each of the plurality of lower electrodes 210 may have a column shape, such as a pillar shape having an inside filled to have a circular horizontal cross-section, but it is not limited thereto. In some implementations, each of the plurality of lower electrodes 210 may have a cylindrical shape having a closed lower portion. In some implementations, the plurality of lower electrodes 210 may have a honeycomb shape in which the plurality of lower electrodes 210 are arranged in zigzag in the first horizontal direction (the X direction) or the second horizontal direction (the Y direction). In some implementations, the plurality of lower electrodes 210 may have a matrix form in which the plurality of lower electrodes 210 are arranged in a row in each of the first horizontal direction (the X direction) and the second horizontal direction (the Y direction). The plurality of lower electrodes 210 may include silicon doped with impurities, a metal such as tungsten or copper, or a conductive metal compound such as titanium nitride. In some implementations, the plurality of lower electrodes 210 may include TiN, CrN, VN, MoN, NbN, TiSiN, TiAlN, or TaAlN.

In FIGS. 3A to 3D, the capacitor dielectric layer 220 may conformally cover surfaces of the plurality of lower electrodes 210. In some implementations, the capacitor dielectric layer 220 may be formed integrally with the plurality of lower electrodes 210 to cover the surfaces of the plurality of lower electrodes 210 together within a certain region. The capacitor dielectric layer 220 may include a material with antiferroelectricity properties, a material with ferroelectricity properties, or a material with a mixture of the antiferroelectricity properties and the ferroelectricity properties. For example, the capacitor dielectric layer 220 may be formed of silicon oxide, metal oxide, or a combination thereof. In some embodiments, the capacitor dielectric layer 220 may include a dielectric material comprised of ABO3 or MOx. For example, the capacitor dielectric layer 220 may be formed of SiO, TaO, TaAlO, TaON, AlO, AlSiO, HfO, HfSiO, ZrO, RuO, WO, HfZrO, ZrSiO, TiO, TiAlO, VO, NbO, MoO, MnO, LaO YO, CoO, NiO, CuO, ZnO, FeO, SrO, BaO, BST((Ba,Sr)TiO), STO(SrTiO), BTO(BaTiO), PTO(Pb- TiO), AgNbO, BiFeO, PZT(Pb(Zr, Ti)O), (Pb,La)(Zr,Ti)O, Ba(Zr,Ti)O, Sr(Zr,Ti)O, or a combination thereof.

The upper electrode 230 may be formed integrally with the plurality of lower electrodes 210 on the plurality of lower electrodes 210 within a certain region. The plurality of lower electrodes 210, the capacitor dielectric layer 220, and the upper electrode 230 may constitute the plurality of capacitor structures 200 within a certain region.

The upper electrode 230 may include silicon doped with impurities, a metal, such as tungsten or copper, or a conductive metal compound, such as titanium nitride. In some implementations, the upper electrode 230 may include TiN, CrN, VN, MoN, NbN, TiSiN, TiAlN, or TaAlN. In some implementations, the upper electrode 230 may have a stacked structure of at least two of a semiconductor material layer doped with impurities, a main electrode layer, and an interface layer. The doped semiconductor material layer may include, for example, doped polysilicon or doped polycrystalline silicon germanium (poly-SiGe). The main electrode layer may be formed of a metal material. The main electrode layer may be formed of, for example, W, Ru, RuO, Pt, PtO, Ir, IrO, SrRuO (SRO), (Ba,Sr)RuO (BSRO), CaRuO (CRO), BaRuO, La(Sr,Co)O, or so on. In some implementations, the main electrode layer may be formed of W. The interface layer may include at least one of metal oxide, metal nitride, metal carbide, and metal silicide.

Figure 4:
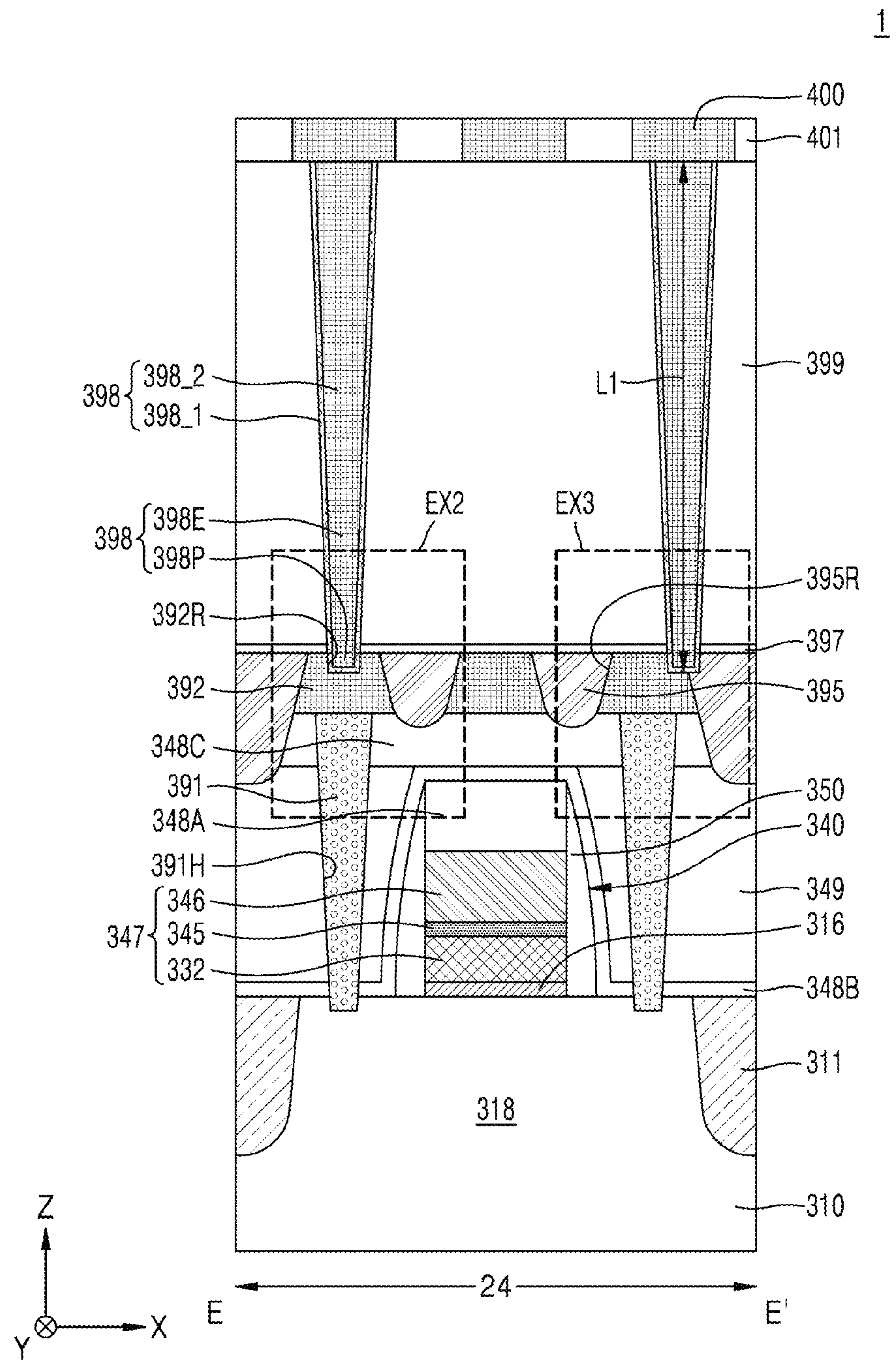
FIG. 4 is a cross-sectional view taken along line E-E' of FIG. 2 according to some implementations.

FIG. 4 is a cross-sectional view taken along line E-E' of FIG. 2 illustrating a peripheral circuit region 24 of the semiconductor device 1 according to some implementations. In FIG. 4, a device isolation layer 311 may be in a substrate 310 of the peripheral circuit region 24 to define a second active region 318. The device isolation layer 311 may be similar to the device isolation layer 111, as described with reference to FIGS. 3A to 3D. For example, the device isolation layer 311 may include one or more materials selected from silicon oxide and silicon nitride.

In FIG. 4, a peripheral circuit insulating layer pattern 316 may extend along an upper surface of the substrate 310 in the peripheral circuit region 24. The peripheral circuit insulating layer pattern 316 may include, for example, silicon oxide, silicon nitride, silicon oxynitride, or a high-k dielectric material with a higher dielectric constant than silicon oxide. A peripheral circuit gate structure 340 may be on the peripheral circuit insulating layer pattern 316. The peripheral circuit gate structure 340 may include a peripheral circuit gate line 347 and a peripheral circuit capping pattern 348A covering the peripheral circuit gate line 347. In some implementations, the peripheral circuit gate line 347 may include a first conductive layer 332, a second conductive layer 345, and a third conductive layer 346 that are sequentially stacked.

In some implementations, components of the peripheral circuit gate structure 340 may be respectively placed at substantially the same levels as components of the bit line 147 in the cell region 20 (see FIG. 1) on the substrate 110. For example, the first conductive layer 332 may be at substantially the same level as the conductive semiconductor pattern 132 (see FIGS. 3A to 3D), the second conductive layer 345 may be at substantially the same level as the first metallic conductive pattern 145 (see FIGS. 3A to 3D), and the third conductive layer 346 may be at substantially the same level as the second metallic conductive pattern 146 (see FIGS. 3A to 3D).

In some implementations, the first conductive layer 332 may be formed by the same process as the conductive semiconductor pattern 132. For example, the first conductive layer 332 may be formed of a material identical to the material of the conductive semiconductor pattern 132. For example, the first conductive layer 332 may be formed of doped polysilicon. A thickness of the first conductive layer 332 in the vertical direction (the Z direction) may be substantially the same as a thickness of the conductive semiconductor pattern 132 in the vertical direction (the Z direction).

In some implementations, the second conductive layer 345 may be formed by the same process as the first metallic conductive pattern 145. For example, the second conductive layer 345 may be formed of a material identical to the material of the first metallic conductive pattern 145. For example, the second conductive layer 345 may be formed of titanium nitride (TiN) or Ti—Si—N(TSN). A thickness of the second conductive layer 345 in the vertical direction (the Z direction) may be substantially the same as a thickness of the first metallic conductive pattern 145 in the vertical direction (Z-direction).

In some implementations, the third conductive layer 346 may be formed by the same process as the second metallic conductive pattern 146. For example, the third conductive layer 346 may be formed of a material identical to the material of the second metallic conductive pattern 146. For example, the third conductive layer 346 may be formed of titanium nitride (TiN) or Ti—Si—N(TSN). A thickness of the third conductive layer 346 in the vertical direction (the Z direction) may be substantially the same as a thickness of the second metallic conductive pattern 146 in the vertical direction (the Z direction).

In some implementations, the peripheral circuit capping pattern 348A may be on the peripheral circuit gate line 347. The peripheral circuit capping pattern 348A may include silicon nitride.

In some implementations, both sidewalls of the peripheral circuit gate structure 340 may be covered by a peripheral circuit spacer 350. The peripheral circuit spacer 350 may include an oxide layer, a nitride layer, or a combination thereof.

In some implementations, the peripheral circuit gate structure 340 and the peripheral circuit spacer 350 may be covered by a protective layer 348B. The protective layer 348B may include silicon nitride. A first interlayer insulating layer 349 may be on the protective layer 348B and around the peripheral circuit gate structure 340. The first interlayer insulating layer 349 may include tonen silazene (TOSZ), but is not limited thereto. The peripheral circuit gate structure 340, the protective layer 348B, and the first interlayer insulating layer 349 may be covered by a peripheral circuit upper insulating capping layer 348C. The peripheral circuit upper insulating capping layer 348C may include silicon nitride.

In some implementations, a plurality of contact plug holes 391H may sequentially penetrate the peripheral circuit upper insulating capping layer 348C, the first interlayer insulating layer 349, and the protective layer 348B in the third direction (the Z direction). A plurality of contact plugs 391 connected to the second active region 318 of the substrate 110 in the peripheral circuit region 24 may be in the plurality of contact plug holes 391H. The plurality of contact plugs 391 may be on both sides of the peripheral circuit gate structure 340, and may be separated from the peripheral circuit gate structure 340 in the first horizontal direction (the X direction). The plurality of contact plugs 391 may each be separated from the peripheral circuit gate structure 340 in the first horizontal direction (the X direction) with the first interlayer insulating layer 349, the protective layer 348B, and the peripheral circuit spacer 350 therebetween.

A metal silicide layer may be between the contact plug 391 and the second active region 318 of the substrate 110 in the peripheral circuit region 24. For example, the metal silicide layer may be formed of cobalt silicide, nickel silicide, or manganese silicide.

In some implementations, the contact plug 391 may include titanium nitride (TiN). For example, the contact plug 391 may include titanium nitride (TiN) that fills the contact plug hole 391H, in which the contact plug 391 may be formed by filling the contact plug hole 391H with titanium nitride (TiN).

In some implementations, unlike FIG. 4, the contact plug 391 may include a conductive barrier pattern including titanium nitride (TiN) on an inner wall of the contact plug hole 391H, and a conductive layer filling the contact plug hole 391H on the conductive barrier pattern and including tungsten (W). In some implementations, the contact plug 391 may have a shape of which a width in the first horizontal direction (the X direction) decreases as a vertical level of the contact plug 391 lowers. For example, the contact plug 391 may have a shape of which a width in the first horizontal direction (the X direction) gradually decreases as the vertical level of the contact plug 391 lowers. The shape of the contact plug 391 is described below with reference to FIG. 5.

In some implementations, a plurality of wiring pads 392 may be on the plurality of contact plugs 391. For example, the plurality of wiring pads 392 in contact with the plurality of contact plugs 391 may be on the plurality of contact plugs 391. For example, upper surfaces of the plurality of contact plugs 391 may be in contact with lower surfaces of the plurality of wiring pads 392, and the plurality of wiring pads 392 may each have an island shape. For example, the plurality of wiring pads 392 may each have a line shape extending in the second horizontal direction (the Y direction).

In some implementations, the plurality of wiring pads 392 may each have a shape of which a width in the first horizontal direction (the X direction) increases as a vertical level of the wiring pad 392 lowers. For example, the plurality of wiring pads 392 may have a shape of which a width in the first horizontal direction (the X direction) gradually increases as the vertical level of the wiring pad 392 lowers. In some implementations, recess portion 392R may be on an upper surface of the wiring pad 392. The shape of the wiring pad 392 is described below with reference to FIG. 5.

In some implementations, the wiring pad 392 may include a material different from a material of the contact plug 391. When the contact plug 391 includes titanium nitride (TiN) that fills the contact plug hole 391H, the wiring pad 392 may include a material different from the titanium nitride (TiN). For example, when the contact plug 391 includes titanium nitride (TiN) that fills the contact plug hole 391H, the wiring pad 392 may include tungsten (W). For example, the wiring pad 392 may not include titanium nitride (TiN).

In some implementations, when the contact plug 391 includes a conductive barrier pattern on an inner wall of the contact plug hole 391H and a conductive layer filling the contact plug hole 391H on the conductive barrier pattern, the wiring pad 392 may also include a conductive barrier pattern and a conductive layer on the conductive barrier pattern.

In some implementations, a plurality of second insulating structures 395 may each be between the plurality of wiring pads 392. The plurality of wiring pads 392 may be separated from each other by the second insulating structure 395. The plurality of second insulating structure 395 may be respectively inside a plurality of second recess portions 395R between the plurality of wiring pads 392. A part of each of the plurality of second insulating structures 395 which overlaps the peripheral circuit gate structure 340 in the vertical direction (the Z direction) may be between two of the plurality of wiring pads 392 and may cause an upper portion of the first interlayer insulating layer 349 to be recessed. For example, a part of each of the plurality of second insulating structures 395 which overlaps the peripheral circuit gate structure 340 in the vertical direction (the Z direction) may not completely pass through the peripheral circuit upper insulating capping layer 348C. A part of each of the plurality of second insulating structures 395 which does not overlap the peripheral circuit gate structure 340 in the vertical direction (the Z direction) may be between two of the plurality of wiring pads 392 and may pass through the peripheral circuit upper insulating capping layer 348C to cause an upper portion of the first interlayer insulating layer 349 to be recessed.

In some implementations, the second insulating structure 395 may have a shape of which a width in the first horizontal direction (the X direction) decreases as the vertical level of the second insulating structure 395 lowers. For example, the second insulating structure 395 may have a shape of which a width in the first horizontal direction (the X direction) gradually decreases as the vertical level of the second insulating structure 395 lowers. The shape of the second insulating structure 395 is described below with reference to FIG. 5.

In some implementations, upper surfaces of the plurality of wiring pads 392 are at the same vertical level as upper surfaces of the plurality of second insulating structures 395. When the plurality of recess portions 392R are respectively on upper surfaces of the plurality of wiring pads 392 respectively, non-recess portions on the upper surfaces of the plurality of wiring pads 392, that is, portions having a high vertical level, may be at the same vertical level as the upper surfaces of the plurality of second insulating structures 395. In some implementations, the plurality of second insulating structures 395 fill spaces between the plurality of wiring pads 392 and cover upper surfaces of the plurality of wiring pads 392, and accordingly, upper surfaces of the plurality of second insulating structures 395 may be at a higher vertical level than the upper surfaces of the plurality of wiring pads 392.

In some implementations, the plurality of second insulating structures 395 may each include silicon nitride. In some implementations, the plurality of second insulating structures 395 may each include an interlayer insulating layer and an etch stop layer. For example, the interlayer insulating layer may be formed of oxide, and the etch stop layer may be formed of nitride. For example, the etch stop layer may be formed of a silicon nitride or silicon boron nitride (SiBN). In some embodiments, the plurality of second insulating structures 395 may be formed by the same process as the first insulating structure 195 (see FIGS. 3A to 3D).

In some implementations, a second upper insulating layer 397 may be on the plurality of wiring pads 392 and the plurality of second insulating structures 395. The second upper insulating layer 397 may include a material different from materials of the plurality of second insulating structures 395. When the plurality of second insulating structures 395 each include silicon nitride, the second upper insulating layer 397 may include silicon carbonitride.

In some implementations, a second interlayer insulating layer 399 may be on the second upper insulating layer 397. A metal via 398 may pass through the second upper insulating layer 397 and the second interlayer insulating layer 399 to be connected to the wiring pad 392. Specifically, the metal via 398 may be on an upper surface of the wiring pad 392 and in contact with the wiring pad 392. In some implementations, the metal via 398 may extend into the recess portion 392R on the upper surface of the wiring pad 392 to be in contact with the wiring pad 392.

In some implementations, the metal via 398 may include a protrusion 398P within the recess portion 392R on the upper surface of the wiring pad 392, and an extension portion 398E extending in the vertical direction (the Z direction) on the protrusion 398P. Specifically, the extension portion 398E may extend in the vertical direction (the Z direction) from an upper surface of the protrusion 398P into the second upper insulating layer 397 and the second interlayer insulating layer 399.

In some implementations, a width of the protrusion 398P of the metal via 398 in the first horizontal direction (the X direction) may be less than a width of the extension portion 398E in the first horizontal direction (the X direction). In some implementations, the metal via 398 may have a shape of which a width in the first horizontal direction (the X direction) decreases as a vertical level of the metal via 398 lowers. For example, the metal via 398 may have a shape of which a width in the first horizontal direction (the X direction) gradually decreases as the vertical level of the metal via 398 lowers. The shape of the metal via 398 is described below with reference to FIG. 5.

In some implementations, a length L1 of the metal via 398 in the vertical direction (the Z direction) may be about 10 μm or greater. For example, the length L1 of the metal via 398 in the vertical direction (the Z direction) may be about 10 μm to about 20 μm. For example, the length L1 of the metal via 398 in the vertical direction (the Z direction) may be about 12 μm to about 20 μm. In some implementations, metal via 398 may include a conductive barrier pattern 398_1 and a conductive layer 398_2 on the conductive barrier pattern 398_1. For example, the conductive barrier pattern 398_1 may include titanium nitride (TiN), and the conductive layer 398_2 may include tungsten (W).

In some implementations, an upper wiring pad 400 may be on the metal via 398 and the second interlayer insulating layer 399. For example, the upper wiring pad 400 may include tungsten (W). An insulating layer 401 surrounding the upper wiring pad 400 may be on the metal via 398 and the second interlayer insulating layer 399.

Figure 5:
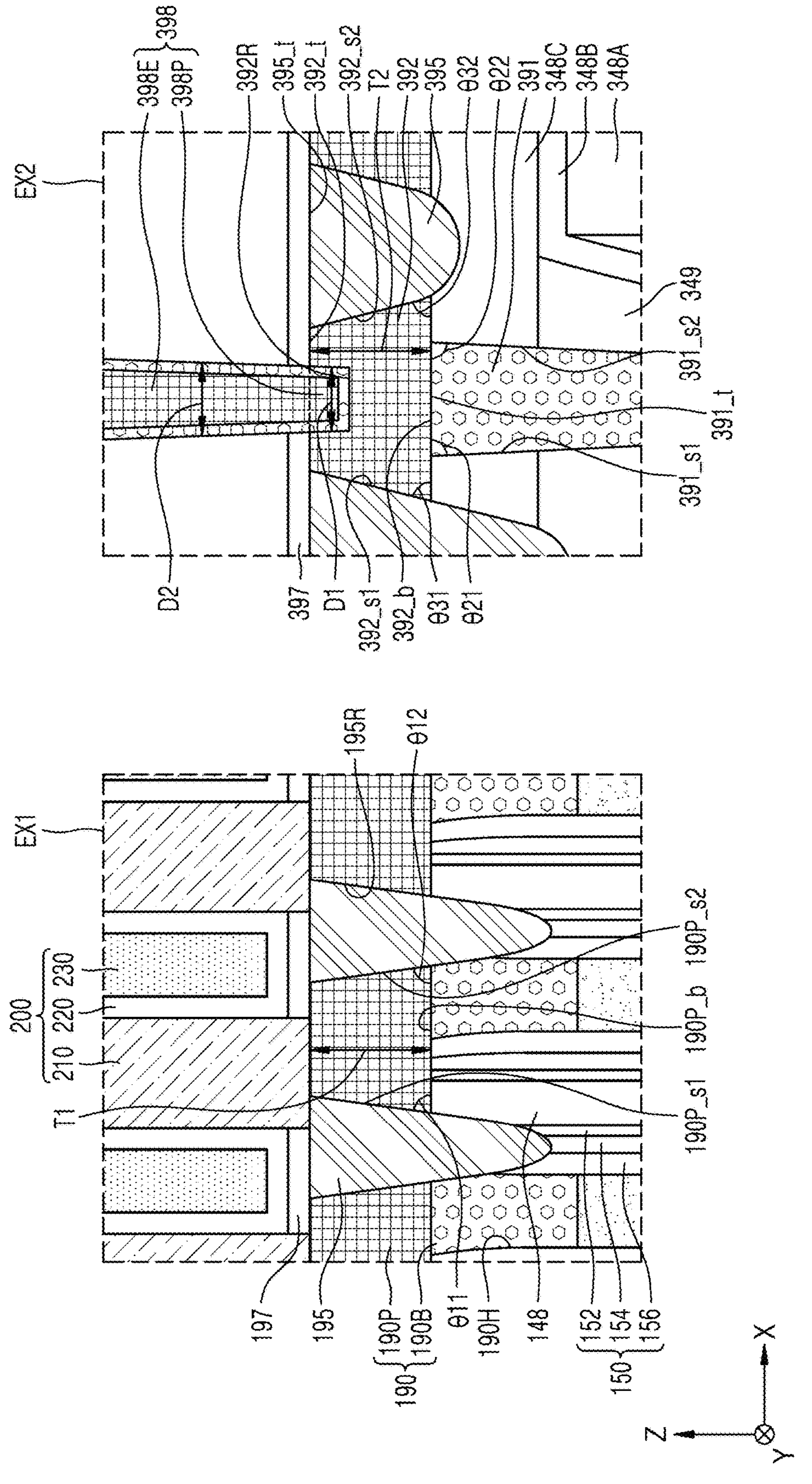
FIG. 5 illustrates enlarged cross-sectional views of an exemplary region EX1 of FIG. 3A and an exemplary region EX2 of FIG. 4 according to some implementations.

FIG. 5 illustrates enlarged cross-sectional views of an exemplary region EX1 of FIG. 3A and an exemplary region EX2 of FIG. 4. FIG. 5 provides enlarged cross-sectional views illustrating the landing pad 190 and the first insulating structure 195 of FIG. 3A, and provides enlarged cross-sectional views illustrating the contact plug 391, the wiring pad 392, the second insulating structure 395, and the metal via 398 of FIG. 4.

In FIG. 5, as described above, the landing pad 190 on the cell region 20 (see FIG. 1) may include the body portion 190B and the pad portion 190P. In some implementations, the pad portion 190P may have a trapezoidal cross-section in which an upper surface and a lower surface are parallel to each other and two side-walls are not parallel to each other. Specifically, the pad portion 190P may have a first side-wall 190P_s1 and a second side-wall 190P_s2 that are opposite to each other and are not parallel to each other. Specifically, the first side-wall 190P_s1 and the second side-wall 190P_s2 of the pad portion 190P may each meet a lower surface 190P_b of the pad portion 190P at an acute angle. For example, the first side-wall 190P_s1 of the pad portion 190P may form a first angle θ11, which is an acute angle, with the lower surface 190P_b of the pad portion 190P. For example, the second side-wall 190P_s2 of the pad portion 190P may form a second angle θ12, which is an acute angle, with the lower surface 190P_b of the pad portion 190P. For example, the first angle θ11 and/or the second angle θ12 may be about 86°. For example, the first angle θ11 and/or the second angle θ12 may be about 85.6°.

In some implementations, the first side-wall 190P_s1 and the second side-wall 190P_s2 of the pad portion 190P may each form an obtuse angle with an upper surface of the pad portion 190P. Accordingly, a width in the first horizontal direction (the X direction) at a vertical level of the upper surface of the pad portion 190P may be less than a width in the first horizontal direction (the X direction) at a vertical level of the lower surface 190P_b. As described above, the pad portion 190P may have a shape of which a width in the first horizontal direction (the X direction) increases as the vertical level of the pad portion 190P lowers. For example, the pad portion 190P may have a shape of which a width in the first horizontal direction (the X direction) gradually increases as the vertical level of the pad portion 190P lowers.

In some implementations, the first insulating structure 195 may be on a sidewall of the pad portion 190P of the landing pad 190. In some implementations, as described above, the first insulating structure 195 may have a shape of which a width in the first horizontal direction (the X direction) decreases as a vertical level of the first insulating structure 195 lowers. As the first insulating structure 195 has a shape of which a width in the first horizontal direction (the X direction) decreases as the vertical level of the first insulating structure 195 lowers, the pad portion 190P may have a shape of which a width increases as the vertical level of the first insulating structure 195 lowers. In some implementations, an upper surface of the first insulating structure 195 may meet a sidewall of the first recess portion 195R at an acute angle.

In FIG. 5, the contact plug 391 on the peripheral circuit region 24 (see FIGS. 1 and 4) may include an upper surface 391_*t* and first and second sidewalls 391_*s*1 and 391_*s*2 opposite to each other. In some implementations, the first side-wall 391_*s*1 and the second side-wall 391_*s*2 of the contact plug 391 may meet the upper surface 391_*t* of the contact plug 391 at an acute angle. For example, the first sidewall 391_*s*1 of the contact plug 391 may form a third angle θ21, which is an acute angle, with the upper surface 391_*t* of the contact plug 391. For example, the second side-wall 391_*s*2 of the contact plug 391 may form a fourth angle θ22, which is an acute angle, with the upper surface 391_*t* of the contact plug 391.

As described above, the contact plug 391 may have a shape of which a width in the first horizontal direction (the X direction) decreases as a vertical level of the contact plug 391 lowers. For example, the contact plug 391 may have a shape of which a width in the first horizontal direction (the X direction) gradually decreases as the vertical level of the contact plug 391 lowers.

In some implementations, the wiring pad 392 in contact with the contact plug 391 may be on the upper surface 391_*t* of the contact plug 391. In some implementations, the wiring pad 392 may have a trapezoidal cross-section in which an upper surface and a lower surface are parallel to each other and two side-walls are not parallel to each other. Specifically, the wiring pad 392 may have a trapezoidal cross-section, except for the recess portion 392R on the upper surface 392_*t*. Specifically, the wiring pad 392 may have a trapezoidal cross-section, except for a portion where the recess portion 392R is formed. Specifically, the wiring pad 392 may have a first sidewall 392_*s*1 and a second sidewall 392_*s*2 that are opposite to each other. Specifically, the first side-wall 392_*s*1 and the second side-wall 392_*s*2 of the wiring pad 392 may meet a lower surface 392_*b* of the wiring pad 392 at an acute angle. For example, the first sidewall 392_*s*1 of the wiring pad 392 may form a fifth angle θ31, which is an acute angle, with the lower surface 392_*b* of the wiring pad 392. For example, the second sidewall 392_*s*2 of the wiring pad 392 may form a sixth angle θ32, which is an acute angle, with the lower surface 392_*b* of the wiring pad 392. For example, the fifth angle θ31 and/or the sixth angle θ32 may be about 85.6° or less. For example, the fifth angle θ31 and/or the sixth angle θ32 may be about 85°. For example, the fifth angle θ31 and/or the sixth angle θ32 may be about 84.9° to about 85.2°.

In some implementations, the first sidewall 392_*s*1 and the second sidewall 392_*s*2 of the wiring pad 392 may form an obtuse angle with the upper surface 392_*t* of the wiring pad 392. Accordingly, the wiring pad 392 may have a shape of which a width in the first horizontal direction (the X direction) increases as a vertical level of the wiring pad 392 lowers, except for a portion where the recess portion 392R is formed. For example, the wiring pad 392 may have a shape of which a width in the first horizontal direction (the X direction) gradually increases as the vertical level of the wiring pad 392 lowers, except for the portion where the recess portion 392R is formed.

In some implementations, the second insulating structure 395 may be on the first sidewall 392_*s*1 and the second sidewall 392_*s*2 of the wiring pad 392. In some implementations, as described above, the second insulating structure 395 may have a shape of which a width in the first horizontal direction (the X direction) decreases as the vertical level of the second insulating structure 395 lowers. As the second insulating structure 395 has a shape of which a width in the first horizontal direction (the X direction) decreases as the vertical level lowers, the wiring pad 392 may have a shape of which a width in the first horizontal direction (the X direction) increases as the vertical level of the second insulating structure 395 lowers, except for a portion where the recess portion 392R is formed. In some implementations, an upper surface 395_*t* of the second insulating structure 395 may meet a sidewall of the second insulating structure 395 at an acute angle.

In some implementations, the metal via 398 in contact with the wiring pad 392 may be on the upper surface 392_*t* of the wiring pad 392. Specifically, the metal via 398 may extend into the recess portion 392R on the upper surface 392_*t* of the wiring pad 392. In some implementations, a vertical level of the uppermost portion of an upper surface of the wiring pad 392 may be higher than a vertical level of a lower surface of the metal via 398.

In some implementations, first and second sidewalls of the metal via 398 which are opposite to each other may form an obtuse angle with the lower surface of the metal via 398. Accordingly, as described above, the metal via 398 may have a shape of which a width in the first horizontal direction (the X direction) decreases as a vertical level of the metal via 398 lowers. For example, a width D1 of the protrusion 398P of the metal via 398 in the first horizontal direction (the X direction) may be less than a width D2 of the extension portion 398E in the first horizontal direction (the X direction). In some implementations, the metal via 398 may have a shape of which a width in the first horizontal direction (the X direction) gradually decreases as a vertical level of the metal via 398 lowers. For example, a width of an upper surface of the protrusion 398P of the metal via 398 in the first horizontal direction (the X direction) may be equal to a width of the extension portion 398E in the first horizontal direction (the X direction).

Hereinafter, the pad portion 190P of the landing pad 190 is compared with the wiring pad 392. In some implementations, a thickness T1 of the pad portion 190P of the landing pad 190 in the vertical direction (the Z direction) may be equal to a thickness T2 of the wiring pad 392 in the vertical direction (the Z direction). In some implementations, a thickness of the first insulating structure 195 in the vertical direction (the Z direction) which is on a sidewall of the pad portion 190P of the landing pad 190 may be different from a thickness of the second insulating structure 395 in the vertical direction (the Z direction) which is on the second sidewall 392_*s*2 of the wiring pad 392.

In some implementations, as described above, the pad portion 190P of the landing pad 190 and the wiring pad 392 may include the same material. Specifically, both the pad portion 190P of the landing pad 190 and the wiring pad 392 may be formed of the same material. For example, both the pad portion 190P of the landing pad 190 and the wiring pad 392 may include tungsten (W). For example, both the pad portion 190P of the landing pad 190 and the wiring pad 392 may be formed of tungsten (W).

In some implementations, an angle between the first side-wall 190P_s1 and the second side-wall 190P_s2 of the pad portion 190P and the lower surface 190P_b of the pad portion 190P may be greater than or equal to an angle between the first side-wall 392_*s*1 and the second side-wall 392_*s*2 of the wiring pad 392 and the lower surface 392_*b* of the wiring pad 392. Specifically, the first angle θ11 and/or the second angle θ12 may be greater than or equal to the fifth angle θ31 and/or the sixth angle θ32. For example, the first angle θ11 and/or the second angle θ12 may be about 86°, while the fifth angle θ31 and/or the sixth angle θ32 may be about 85°.

In some implementations, the second insulating structure 395 of which a width in the first horizontal direction (the X direction) decreases as a vertical level of the second insulating structure 395 lowers, in which interference between the second insulating structure 395 and the contact plug 391 may be improved. Specifically, the second insulating structure 395 may have a portion that overlaps the contact plug 391 in the first horizontal direction (the X direction), and there is a risk that the second insulating structure 395 interfere the contact plug 391. However, according to some implementations, a width of a portion of the second insulating structure 395 which overlaps the contact plug 391 in the first horizontal direction (X direction) decreases in the first horizontal direction (X direction), and interference between the second insulating structure 395 and the contact plug 391 may be improved. Accordingly, the semiconductor device 1 may have improved performance and reliability.

Figure 6:
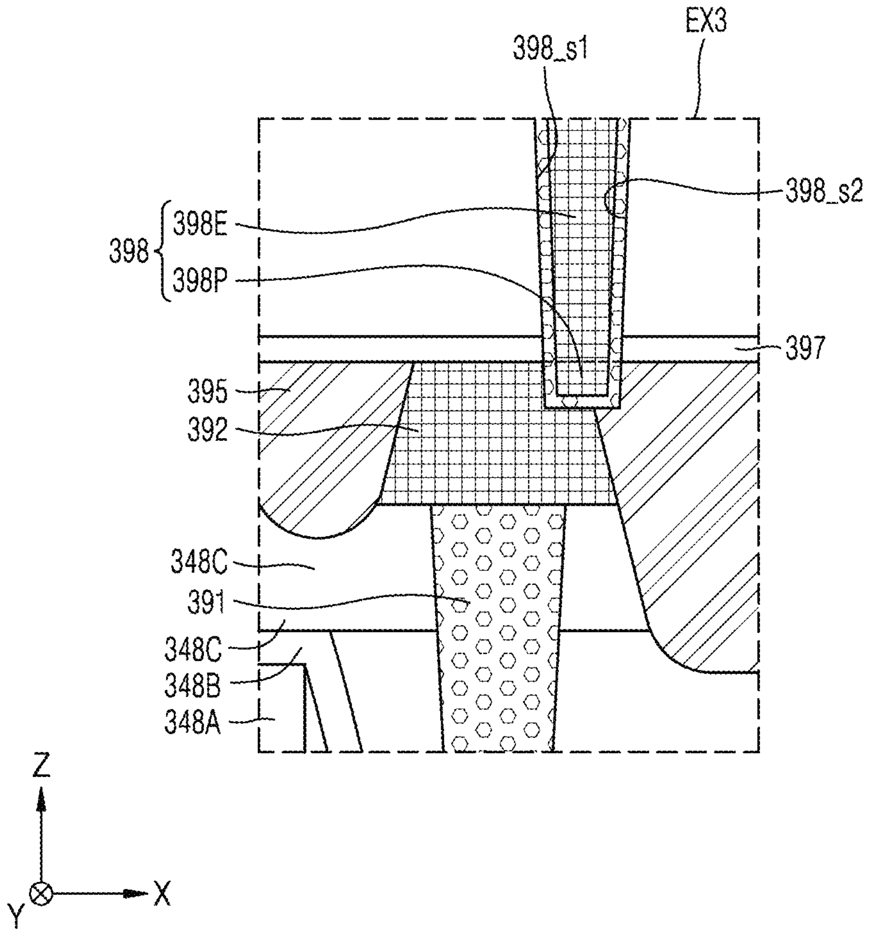
FIG. 6 is an enlarged cross-sectional view of an exemplary region EX3 of FIG. 4 according to some implementations.

FIG. 6 is an enlarged cross-sectional view of an exemplary region EX3 of FIG. 4, illustrating the wiring pad 392 and the metal via 398 of FIG. 4. In FIG. 6, the semiconductor device 1 (see FIGS. 1, 2, 3A to 3D, and 4) may include the wiring pads 392 and metal vias 398 that are offset from each other. Specifically, center lines of the wiring pad 392 and the metal via 398 may be offset from each other. A first sidewall 398_*s*1 of the metal via 398 may be in contact with the upper surface 392_*t* of the wiring pad 392, and a second sidewall 398_*s*2 of the metal via 398 may not be in contact with the upper surface 392_*t* of the wiring pad 392. For example, the second sidewall 398_*s*2 of the metal via 398 may be in contact with an upper surface of the second insulating structure 395. In some implementations, even when the second sidewall 398_*s*2 of the metal via 398 is not in contact with the upper surface 392_*t* of the wiring pad 392, the metal via 398 may still be in contact with the wiring pad 392.

In some implementations, the wiring pad 392 of which a width in the first horizontal direction (the X direction) increases as a vertical level of the wiring pad 392 lowers, a contact margin of the wiring pad 392 and the metal via 398 may increase. Specifically, even when the wiring pad 392 and the metal via 398 are offset from each other, the wiring pad 392 may be in contact with the metal via 398 by including a portion of which a width increases in the first horizontal direction (the X direction). In particular, as a width of the second insulating structure 395 in the first horizontal direction (the X direction) which is on a sidewall of the wiring pad 392, decreases as a vertical level of the second insulating structure 395 lowers, the wiring pad 392 may have a shape of which a width in the first horizontal direction (X direction) increases as a vertical level of the wiring pad 392 lowers. Accordingly, the semiconductor device 1 may have improved performance and reliability.

FIGS. 7 to 11 are cross-sectional views of exemplary semiconductor devices 1A, 1B, 1C, 1D, and 1E according to some implementations. Hereinafter, descriptions are focused on differences between semiconductor devices 1A, 1B, 1C, 1D, and 1E and the semiconductor device 1 described with reference to FIGS. 1, 2, 3A to 3D, 4, and 5.

Figure 7:
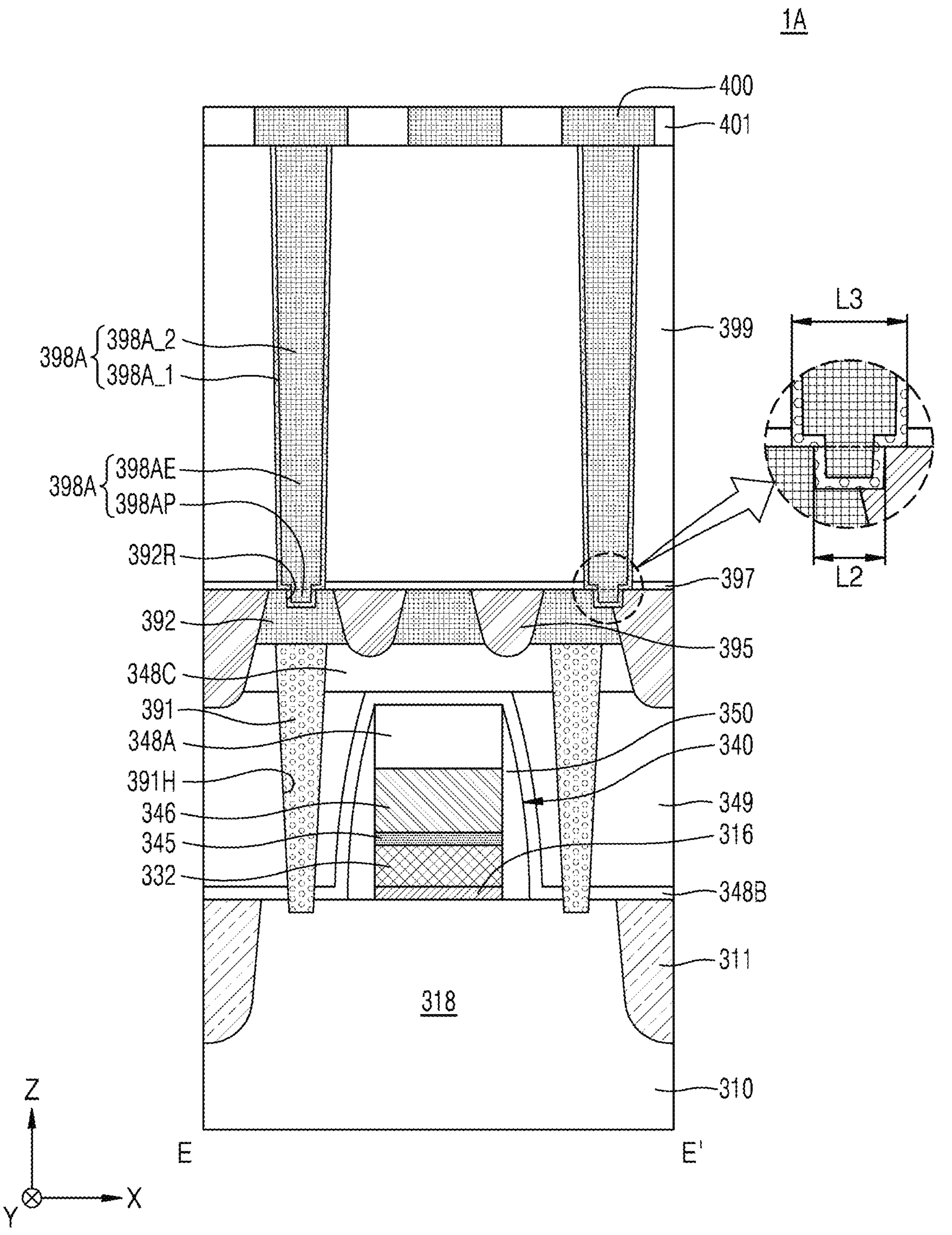
FIGS. 7 to 11 are cross-sectional views of exemplary semiconductor devices according to some implementations.

In FIG. 7, the semiconductor device 1A may include a metal via 398A connected to a wiring pad 392 by passing through a second upper insulating layer 397 and a second interlayer insulating layer 399. In some implementations, the metal via 398A may include a conductive barrier pattern 398A_1 and a conductive layer 398A_2 on the conductive barrier pattern 398A_1. Specifically, the metal via 398A may include a protrusion 398AP in a recess portion 392R on an upper surface of the wiring pad 392, and an extension portion 398AE extending in the vertical direction (the Z direction) on the protrusion 398AP. In some implementations, an upper surface of the protrusion 398AP of the metal via 398A may be at the same vertical level as a lower surface of the extension portion 398AE of the metal via 398A.

In some implementations, the metal via 398A may include a portion of which a width in the first horizontal direction (the X direction) decreases as a vertical level of the metal via 398A lowers. For example, the metal via 398A may include a portion of which a width in the first horizontal direction (the X direction) decreases as the vertical level of the metal via 398A discontinuously lowers. For example, the metal via 398A may include a portion of which a width in the first horizontal direction (the X direction) decreases with a step difference. For example, a width of the metal via 398A in the first horizontal direction (the X direction) may decrease at a boundary between the protrusion 398AP and the extension portion 398AE.

In some implementations, a width of the protrusion 398AP of the metal via 398A in the first horizontal direction (the X direction) may be less than the width of the extension portion 398AE in the first horizontal direction (the X direction). Specifically, the greatest width of the protrusion 398AP of the metal via 398A in the first horizontal direction (the X direction) may be less than the smallest width of the extension portion 398AE in the first horizontal direction (the X direction). For example, a width L2 in the first horizontal direction (the X direction) at a vertical level of an upper surface of the protrusion 398AP of the metal via 398 may be less than a width L3 in the horizontal direction (the X direction) at a vertical level of a lower surface of the extension portion 398AE.

In some implementations, the protrusion 398AP of the metal via 398A may include a portion of which a width in the first horizontal direction (the X direction) decreases as a vertical level of the protrusion 398AP lowers. In some implementations, the extension portion 398AE of the metal via 398A may include a portion of which a width in the first horizontal direction (the X direction) decreases as a vertical level of the extension portion 398AE lowers. In some implementations, one of the protrusion 398AP and the extension portion 398AE of the metal via 398A may not include a portion of which a width in the first horizontal direction (the X direction) decreases as a vertical level thereof lowers.

Figure 8:
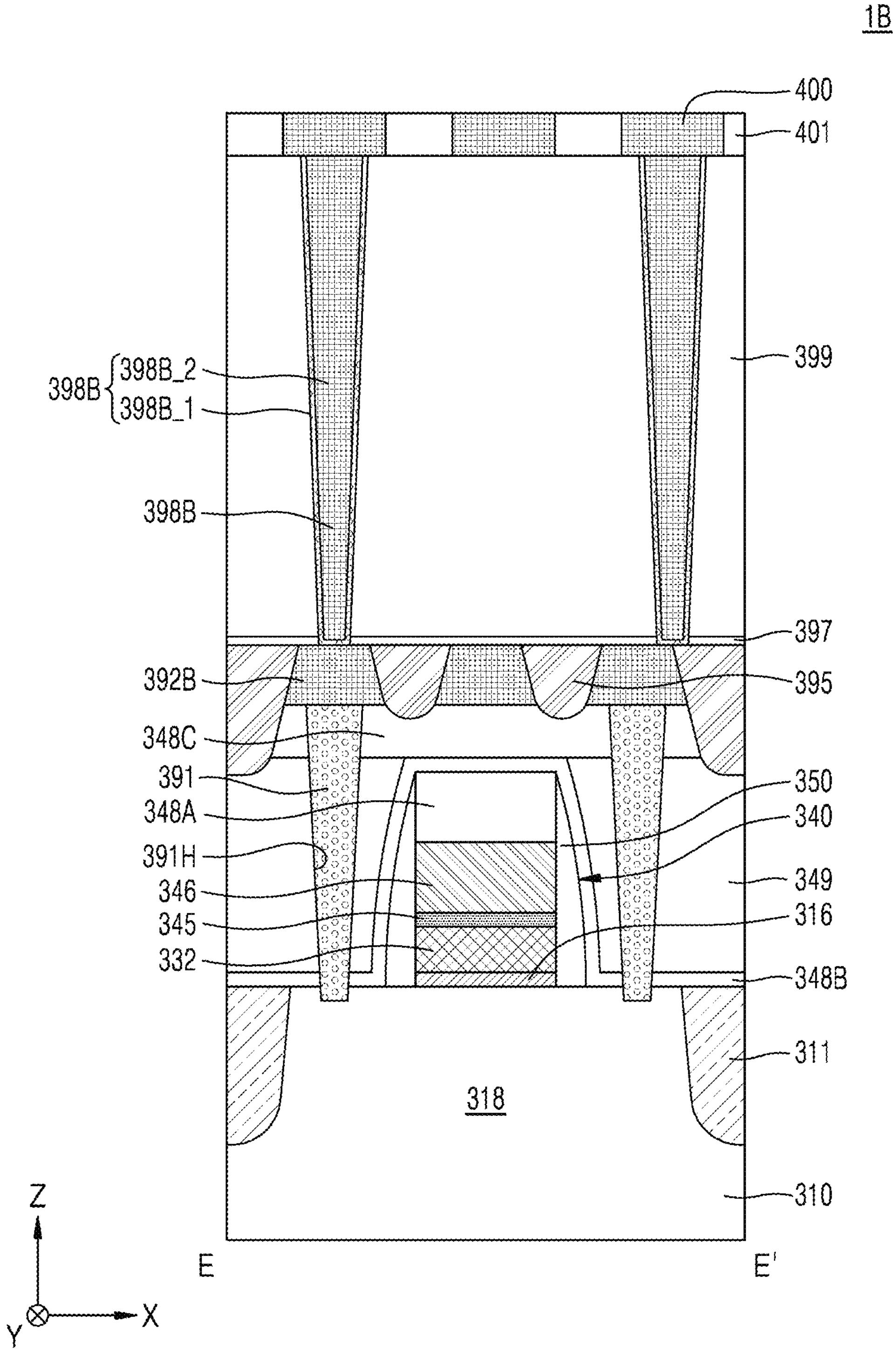

In FIG. 8, the semiconductor device 1B may include a wiring pad 392B that is on the contact plug 391 to be in contact with a contact plug 391, and a metal via 398B that is on the wiring pad 392B to be in contact with the wiring pad 392B. The metal via 398B may pass through a second upper insulating layer 397 and a second interlayer insulating layer 399 to be connected to the wiring pad 392B. In some implementations, the metal via 398B may include a conductive barrier pattern 398B_1 and a conductive layer 398B_2 on the conductive barrier pattern 398B_1. In some implementations, unlike the wiring pad 392 of the semiconductor device 1 described with reference to FIGS. 1, 2, 3A to 3D, 4, and 5, the wiring pad 392B may not include a recess portion in an upper surface of the wiring pad 392B. For example, a vertical level of the upper surface of the wiring pad 392B may be the same as a vertical level of a lower surface of the metal via 398B.

Figure 9:
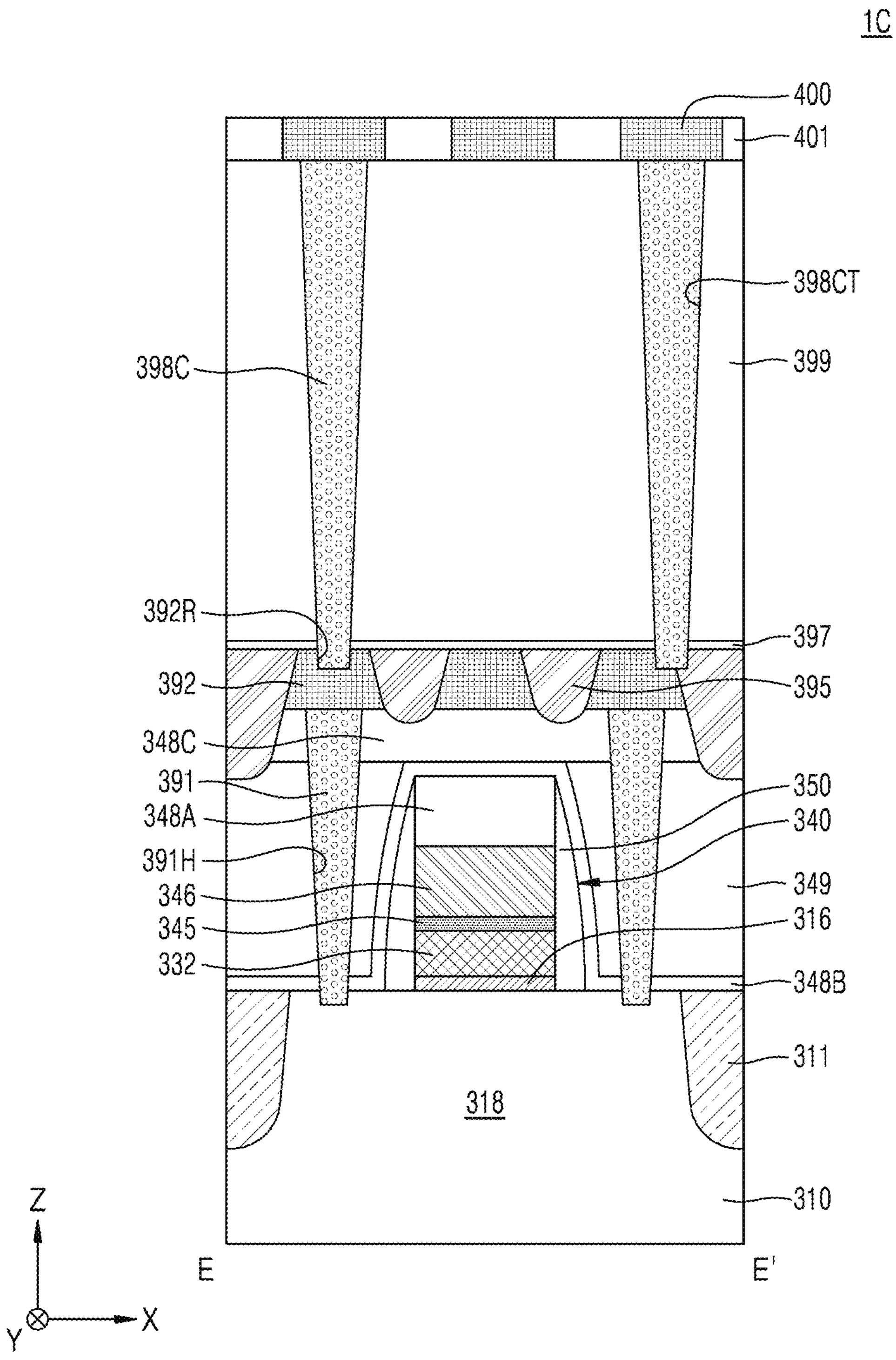

In FIG. 9, the semiconductor device 1C may include a metal via 398C passing through a second upper insulating layer 397 and a second interlayer insulating layer 399 to be connected to a wiring pad 392. Unlike the metal via 398 of the semiconductor device 1 described with reference to FIGS. 1, 2, 3A to 3D, 4, and 5 which includes the conductive barrier pattern 398_1 and the conductive layer 398_2 on the conductive barrier pattern 398_1, the metal via 398C may not include a stacked structure of a conductive barrier pattern and a conductive layer. Specifically, the metal via 398C may be formed by burying titanium nitride (TiN) in a metal via trench 398CT penetrating the second upper insulating layer 397 and the second interlayer insulating layer 399. In some implementations, the metal via 398C may include titanium nitride (TiN) that fills the metal via trench 398CT.

Figure 10:
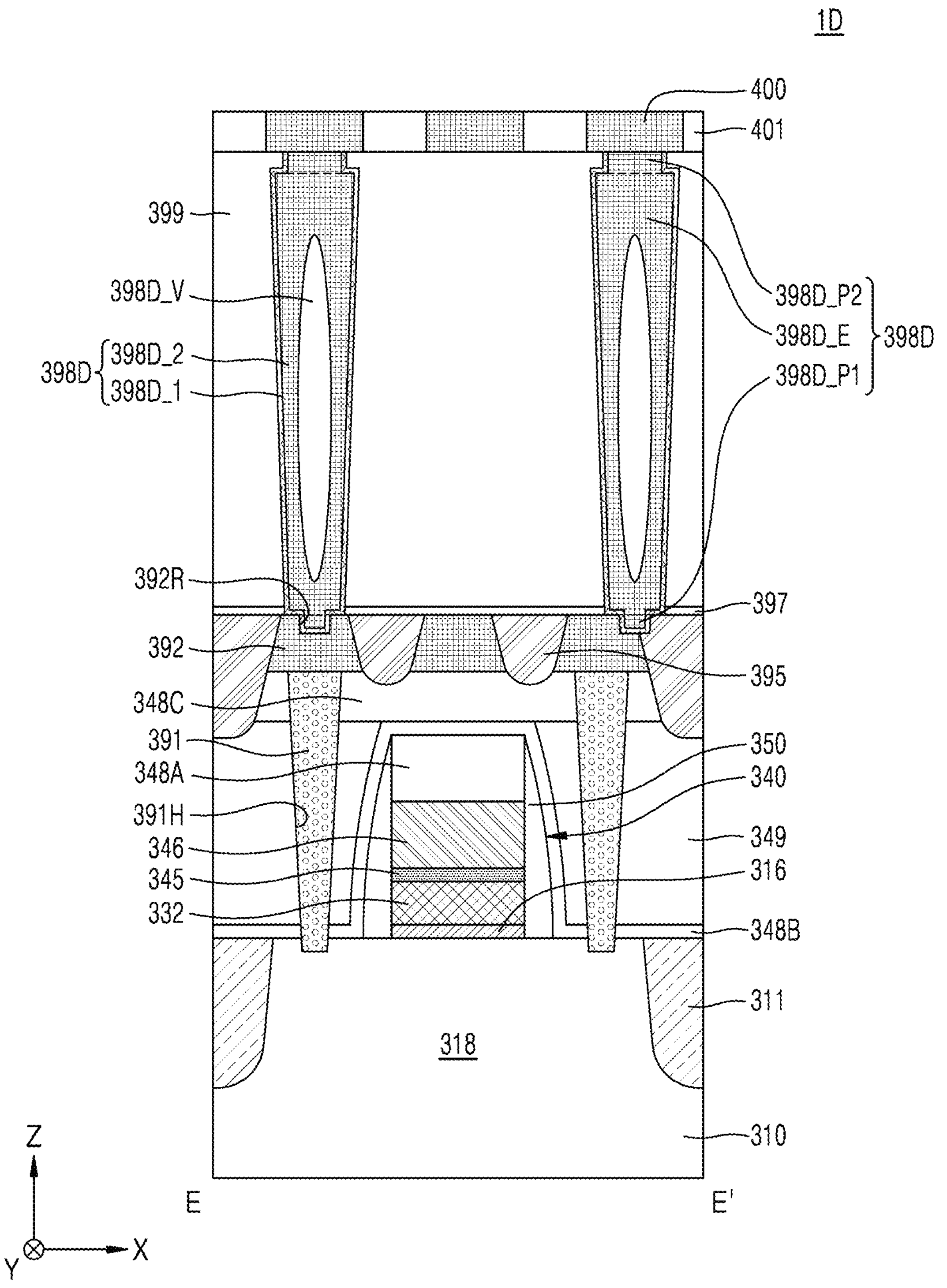

In FIG. 10, the semiconductor device 1D may include a metal via 398D passing through a second upper insulating layer 397 and a second interlayer insulating layer 399 to be connected to a wiring pad 392. In some implementations, the metal via 398D may include a conductive barrier pattern 398D_1 and a conductive layer 398D_2 on the conductive barrier pattern 398D_1. Specifically, the metal via 398D may include a first protrusion 398D_P1 in a recess portion 392R on an upper surface of the wiring pad 392, an extension portion 398D_E extending in the vertical direction (the Z direction) on the first protrusion 398D_P1, and a second protrusion 398D_P2 between the extension portion 398D_E and an upper wiring pad 400. In some implementations, an upper surface of the first protrusion 398D_P1 of the metal via 398D may be at the same vertical level as a lower surface of the extension portion 398D_E, and an upper surface of the extension portion 398D_E may be at the same vertical level as a lower surface of the second protrusion 398D_P2.

In some implementations, a width of an upper surface of the first protrusion 398D_P1 of the metal via 398D in the first horizontal direction (the X direction) may be less than a width of a lower surface of the extension portion 398D_E in the first horizontal direction (the X direction). A width of the upper surface of the extension portion 398D_E in the first horizontal direction (the X direction) may be greater than a width of the lower surface of the second protrusion 398D_P2 in the first horizontal direction (the X direction). In some implementations, the metal via 398D may include a void 398D_V. Specifically, the extension portion 398D_E may include the void 398D_V. For example, the extension portion 398D_E of the metal via 398D may not be filled with a metal material and may include a portion that includes air or is a vacuum. For example, the void 398D_V may be formed in the conductive layer 398D_2.

Figure 11:
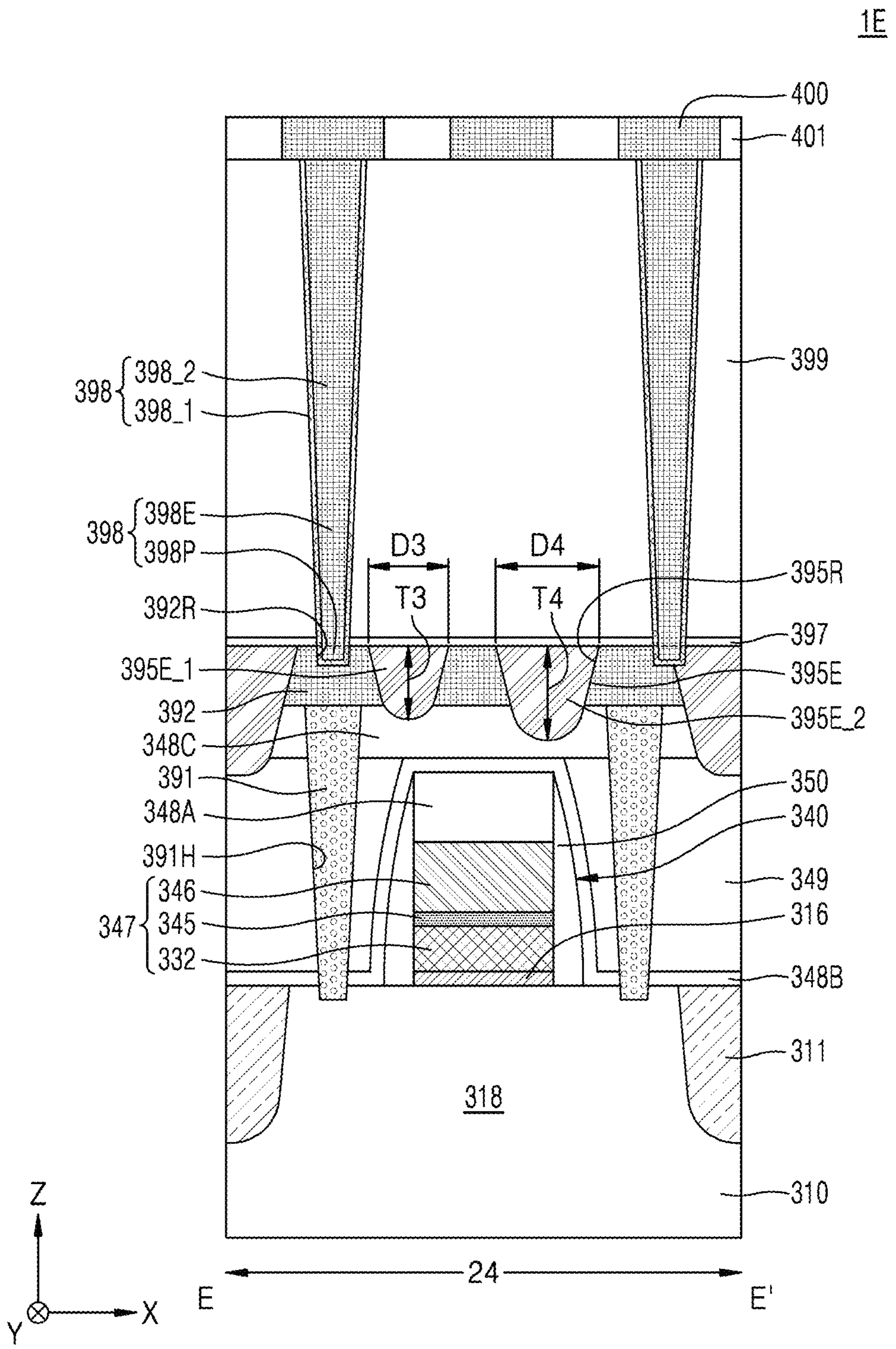

In FIG. 11, the semiconductor device 1E may include a second insulating structure 395E that is between two of a plurality of wiring pads 392 and causes an upper portion of the upper insulating capping layer 348C to be recessed. Specifically, the second insulating structure 395E may include a 2nd-1 insulating structure 395E_1 and a 2nd-2 insulating structure 395E_2 that are different in size. In some implementations, a width D3 of an upper surface of the 2nd-1 insulating structure 395E_1 in the first horizontal direction (the X direction) may be less than a width D4 of an upper surface of the 2nd-2 insulating structure 395E_2 in the first horizontal direction (the X direction). Also, a thickness T3 of the 2nd-1 insulating structure 395E_1 in the vertical direction (the Z direction) may be less than a thickness T4 of the 2nd-2 insulating structure 395E_2 in the vertical direction (the Z direction). For example, as a width of an upper surface of the second insulating structure 395E increases in the first horizontal direction (the X direction), a thickness of the upper surface of the second insulating structure 395E may also increase in the vertical direction (the Z direction). For example, in a process of forming the wiring pad 392 by etching a second metal layer 392L (see FIG. 17B), when a width of an upper surface of the second recess portion 395R in the first horizontal direction (the X direction) increases, the vertically downward etch depth may also increase.

FIGS. 12A, 12B, 13A, 13B, 14, 15A, 15B, 16, 17A, 17B, 18A, 18B, 19A and 19B are cross-sectional views illustrating an exemplary method of manufacturing the semiconductor device 1 according to some implementations. Specifically, FIGS. 10A, 11A, 13A, 15A, 16, 17A, 18A, and 19A are cross-sectional views corresponding to the cross-section taken along line A-A' of FIG. 2, and FIGS. 12B, 13B, 14, 15B, 17B, 18B, and 19B are cross-sectional views corresponding to the cross-section taken along line E-E' of FIG. 2.

Figure 12A:
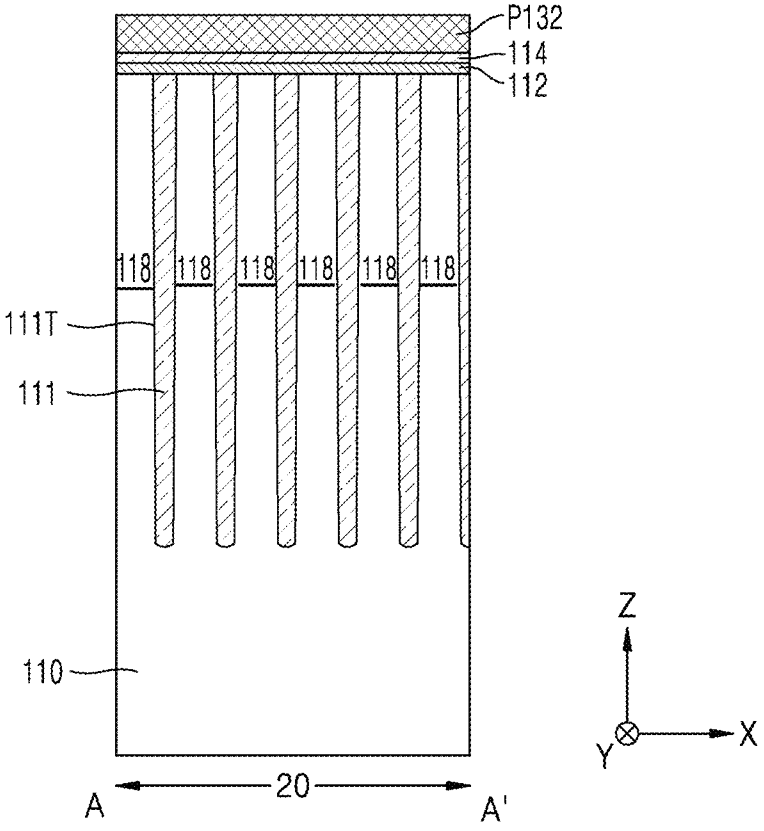
FIGS. 12A, 12B, 13A, 13B, 14, 15A, 15B, 16, 17A, 17B, 18A, 18B, 19A, and 19B are cross-sectional views illustrating an exemplary method of manufacturing a semiconductor device according to some implementations.
Figure 12B:
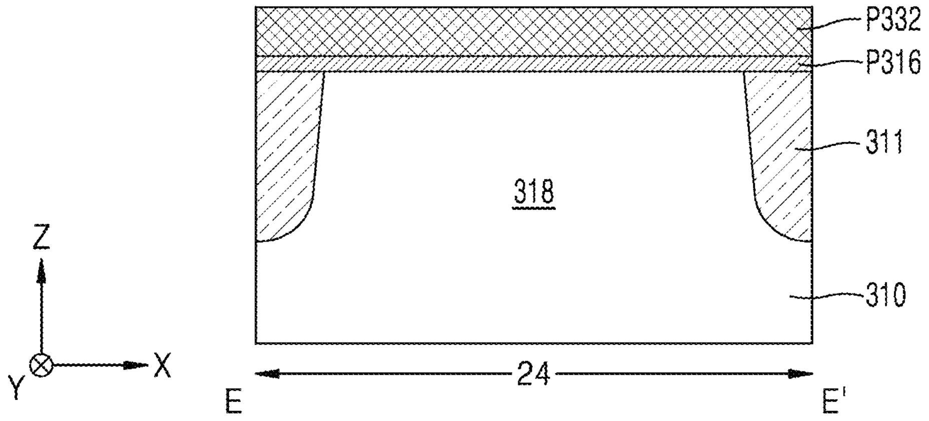

In FIGS. 12A and 12B, a plurality of device isolation trenches 111T and a plurality of device isolation layers 111 may be formed in a cell region 20 of a substrate 110 to define a plurality of first active regions 118. Also, a plurality of device isolation layers 311 may be formed in a peripheral circuit region 24 of the substrate 110 to define a plurality of second active regions 318. Then, a plurality of word lines 120 extending in the first horizontal direction (the X direction) may be formed in the cell region 20 of the substrate 110.

Subsequently, insulating layer patterns 112 and 114 may be formed in the cell region 20 of the substrate 110, and a free peripheral circuit insulating layer pattern P316 may be formed in the peripheral circuit region 24 of the substrate 110. Thereafter, a free conductive semiconductor pattern P132 may be formed on the insulating layer patterns 112 and 114 in the cell region 20, and a free first conductive layer P332 may be formed on the free peripheral circuit insulating layer pattern P316 in the peripheral circuit region 24. In some implementations, the free conductive semiconductor pattern P132 and the free first conductive layer P332 may be formed simultaneously. In some implementations, the free conductive semiconductor pattern P132 and the free first conductive layer P332 may include Si, Ge, W, WN, Co, Ni, Al, Mo, Ru, Ti, TiN, Ta, TaN, Cu, or a combination thereof. For example, the free conductive semiconductor pattern P132 and the free first conductive layer P332 may include polysilicon.

Figure 13A:
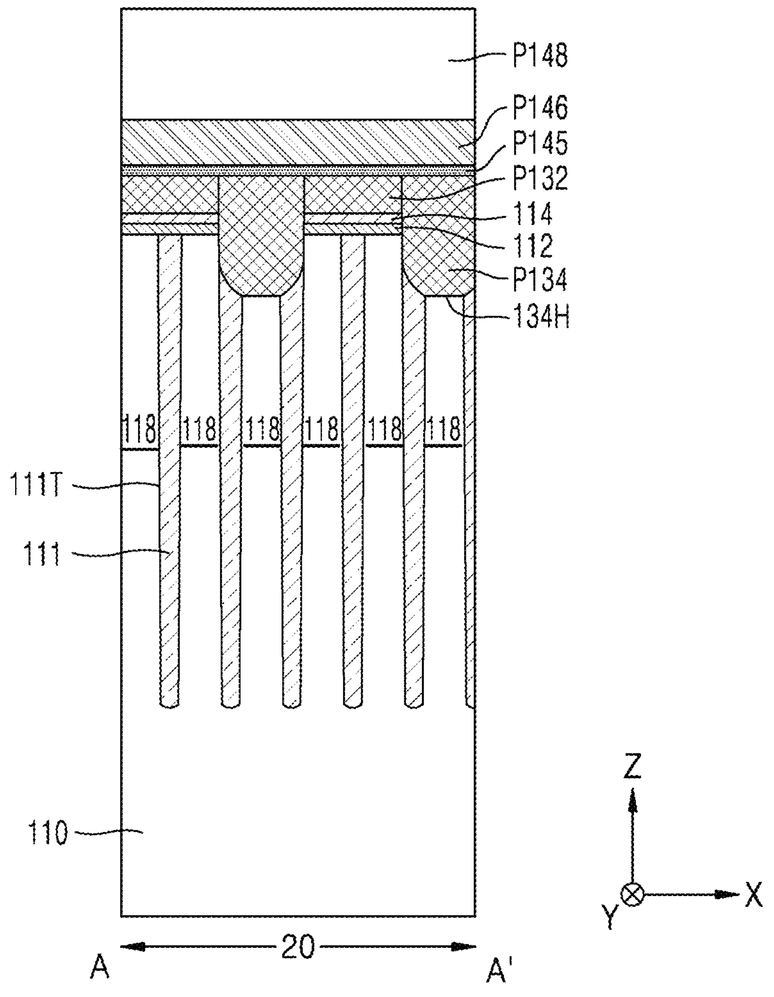
Figure 13B:
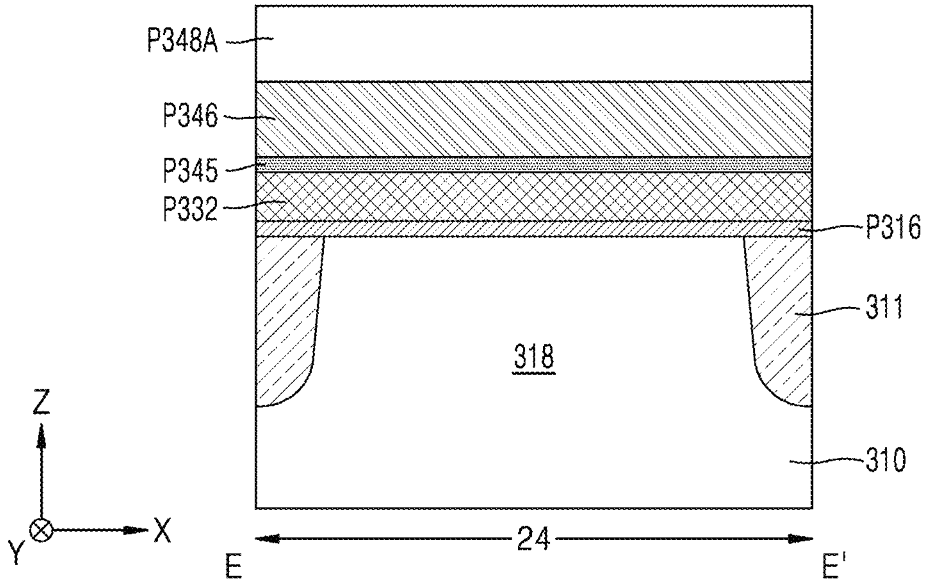
Figure 14:
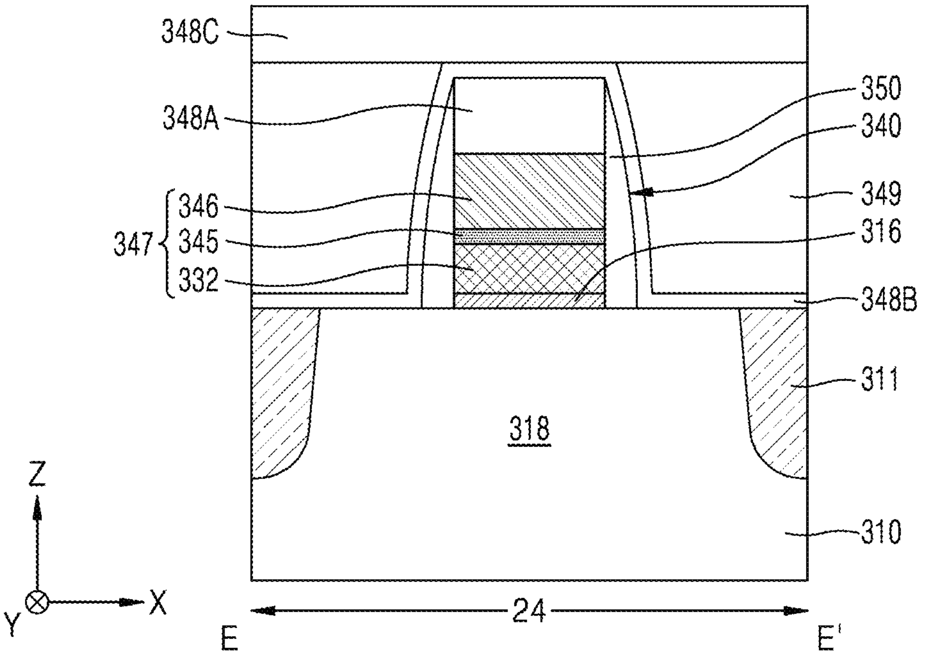

In FIGS. 13A, 13B, and 14, a first mask pattern may be formed on the free conductive semiconductor pattern P132, and then the free conductive semiconductor pattern P132 and the insulating layer patterns 112 and 114 exposed through an opening of the first mask pattern are etched in the cell region 20, and a part of the substrate 110 and a part of the device isolation layer 111, which are exposed as a result of the etching, are etched. Accordingly, a direct contact hole 134H exposing the first active region 118 of the substrate 110 may be formed. Thereafter, the first mask pattern is removed, and a free direct contact P134 is formed in the direct contact hole 134H. In some implementations, an exemplary process for forming the free direct contact P134, a conductive layer having a thickness sufficient to fill the direct contact hole 134H is formed inside the direct contact hole 134H and on an upper portion of the free conductive semiconductor pattern P132, and etch-back for the conductive layer may be performed such that the conductive layer remains only within the direct contact hole 134H. In some implementations, the conductive layer may include polysilicon.

In the cell region 20, a free first metallic conductive pattern P145, a free second metallic conductive pattern P146, and a free insulating capping line P148 may be sequentially formed on the free conductive semiconductor pattern P132 and the free direct contact P134. Also, in the peripheral circuit region 24, a free second conductive layer P345, a free third conductive layer P346, and a free peripheral circuit capping pattern P348A may be sequentially formed on the free first conductive layer P332. In some implementations, the free first metal conductive pattern P145 and the free second conductive layer P345 may be formed simultaneously. In some implementations, the free second metal conductive pattern P146 and the free third conductive layer P346 may be formed simultaneously. The free first metal conductive pattern P145, the free second metal conductive pattern P146, the free second conductive layer P345, and the free third conductive layer P346 may each include TiN, TiSiN, W, tungsten silicide, or a combination thereof. In some implementations, the free peripheral circuit capping pattern P348A may include silicon nitride.

Next, in a state where the cell region 20 is covered with a mask pattern, the free peripheral circuit insulating layer pattern P316, the free first conductive layer P332, the free second conductive layer P345, the free third conductive layer P346, and the free peripheral circuit capping pattern P348A may be patterned in the peripheral circuit region 24. Accordingly, a peripheral circuit gate line 347 including a first conductive layer 332, a second conductive layer 345, and a third conductive layer 346 and a peripheral circuit capping pattern 348A covering the peripheral circuit gate line 347 may be formed on a peripheral circuit insulation layer pattern 316. Then, peripheral circuit spacers 350 are formed on both side-walls of the peripheral circuit gate structure 340, and an ion implantation process is performed to form source/drain regions in the second active region 318 on both sides of the peripheral circuit gate structure 340.

Subsequently, a protective layer 348B may be formed to cover the peripheral circuit gate structure 340 and the peripheral circuit spacers 350. Next, a first interlayer insulating layer 349 may be formed in the peripheral circuit region 24 to fill a space around the peripheral circuit gate structure 340. Subsequently, a peripheral circuit upper insulating capping layer 348C may be formed on the protective layer 348B and the first interlayer insulating layer 349.

Figure 15A:
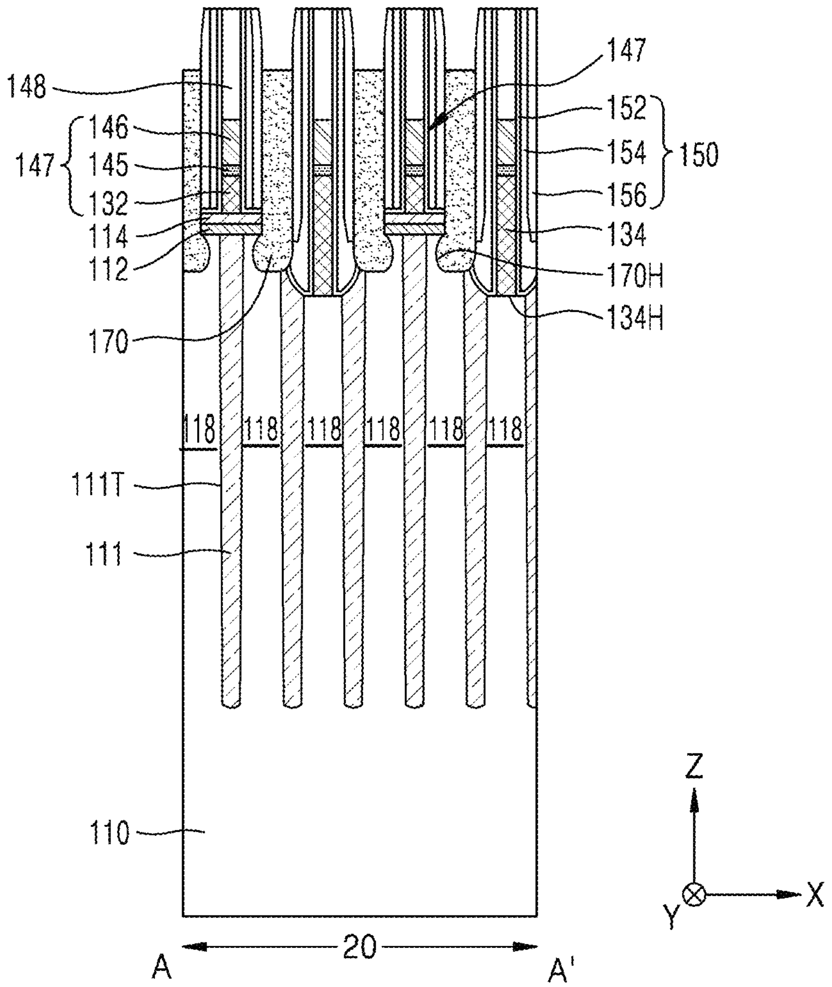
Figure 15B:
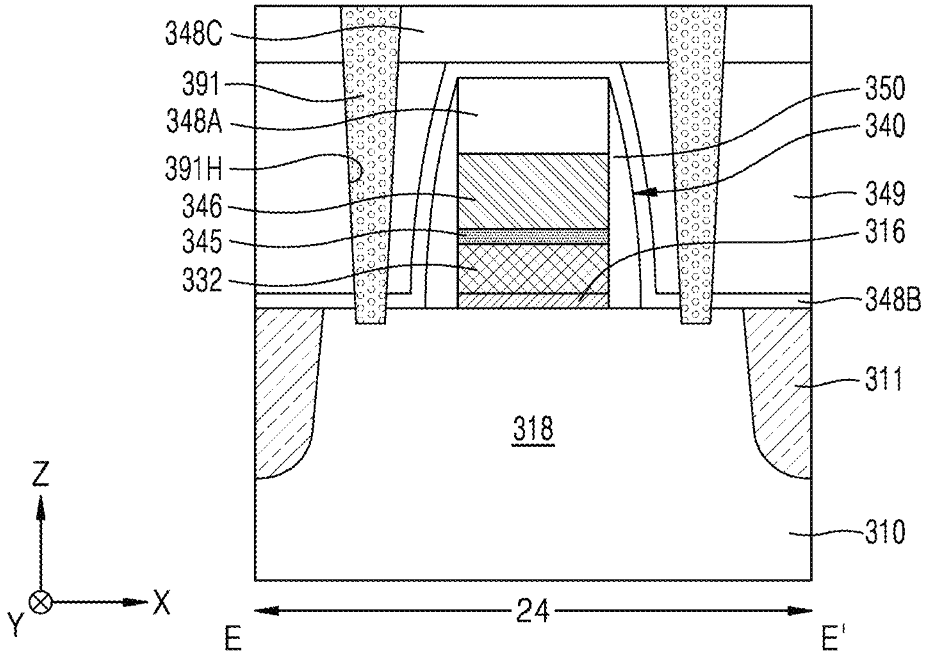

In FIGS. 15A and 15B, a mask pattern may be formed in the peripheral circuit region 24, and the free insulating capping line P148, the free second metallic conductive pattern P146, the free first metal conductive pattern P145, the free conductive semiconductor pattern P132, and the free direct contact P134 may be patterned in the cell region 20. Accordingly, a bit line 147 including the conductive semiconductor pattern 132, the first metal conductive pattern 145, and the second metal conductive pattern 146, a direct contact conductive pattern 134, and an insulating capping line 148 may be formed.

Next, an insulating spacer structure 150 including a first insulating spacer 152, a second insulating spacer 154, and a third insulating spacer 156 may be formed on sidewalls of the bit line 147 and the insulating capping line 148. Then, an insulating material may be buried in a space between a plurality of insulating spacer structures 150, and by partially removing the insulating material, the insulating layer patterns 112, 114, and the substrate 110, a buried contact hole 170H exposing the first active region 118 may be formed. Subsequently, a buried contact 170 may be formed within the buried contact hole 170H.

Next, by partially removing the peripheral circuit upper insulating capping layer 348C, the first interlayer insulating layer 349, the protective layer 348B, and the substrate 110 in the peripheral circuit region 24, a contact plug hole 391H exposing a second active region 318 may be formed. Then, a contact plug 391 may be formed by filling the contact plug hole 391H with titanium nitride (TiN).

Figure 16:
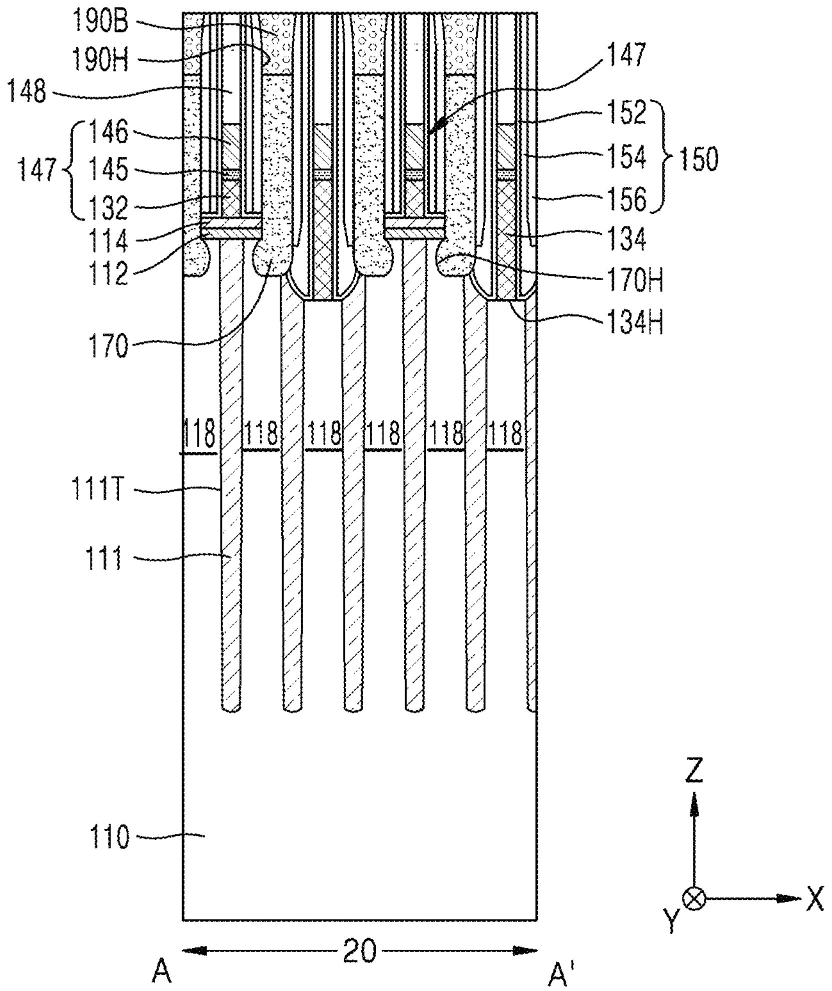

In FIG. 16, after the landing pad hole 190H between the plurality of insulating spacer structures 150 is filled with a conductive material in the cell region 20, an upper portion of the conductive material may be etched to form a body portion 190B of the landing pad 190 (see FIG. 3A). In some implementations, the body portion 190B may include titanium nitride (TiN).

Figure 17A:
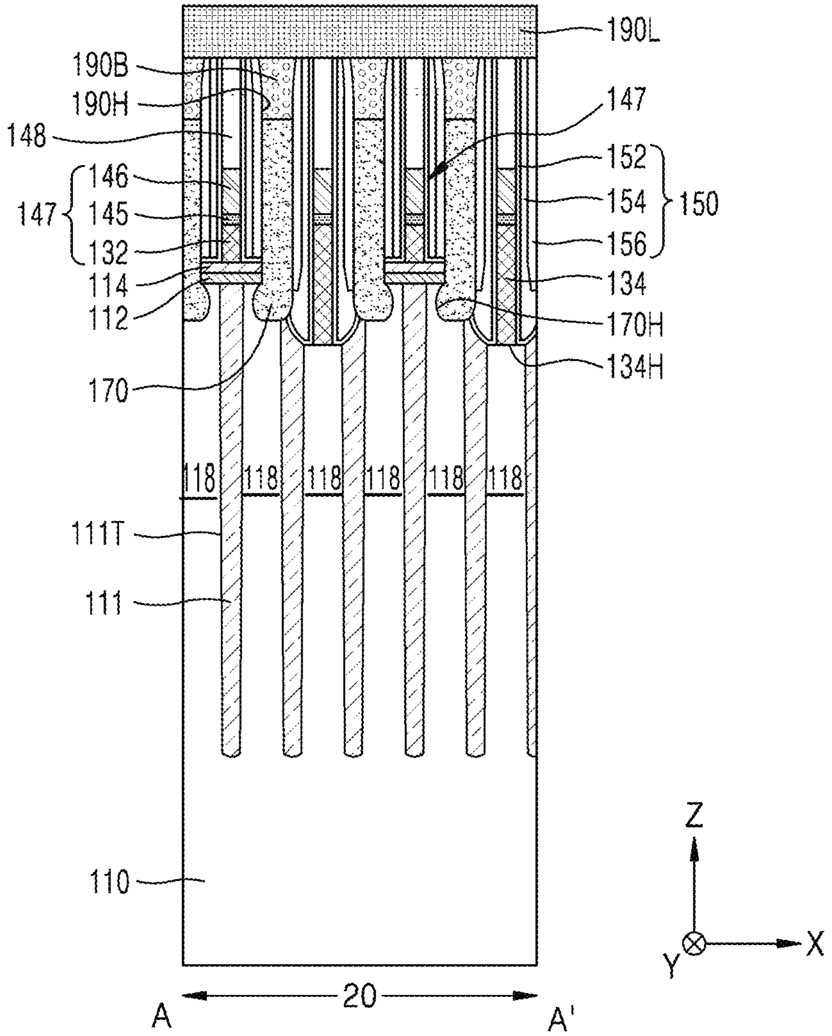
Figure 17B:
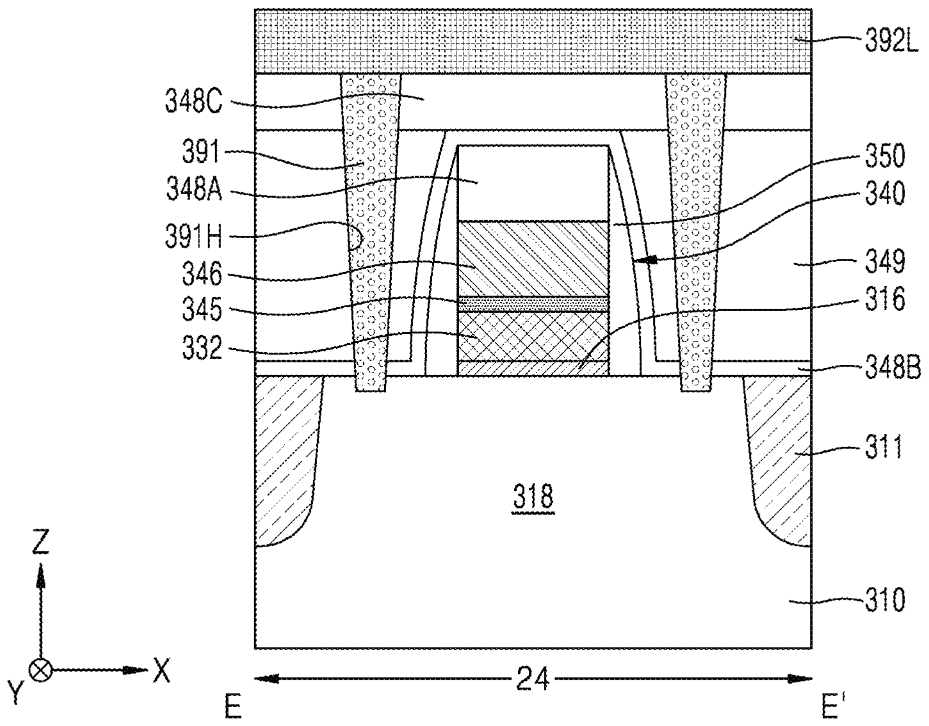

In FIGS. 17A and 17B, a first metal layer 190L and a second metal layer 392L may be respectively formed in the cell region 20 and the peripheral circuit region 24. The first metal layer 190L and the second metal layer 392L may be formed simultaneously. Accordingly, a thickness of the first metal layer 190L in the vertical direction (the Z direction) may be equal to a thickness of the second metal layer 392L in the vertical direction (the Z direction). The first metal layer 190L and the second metal layer 392L may each include tungsten (W).

Figure 18A:
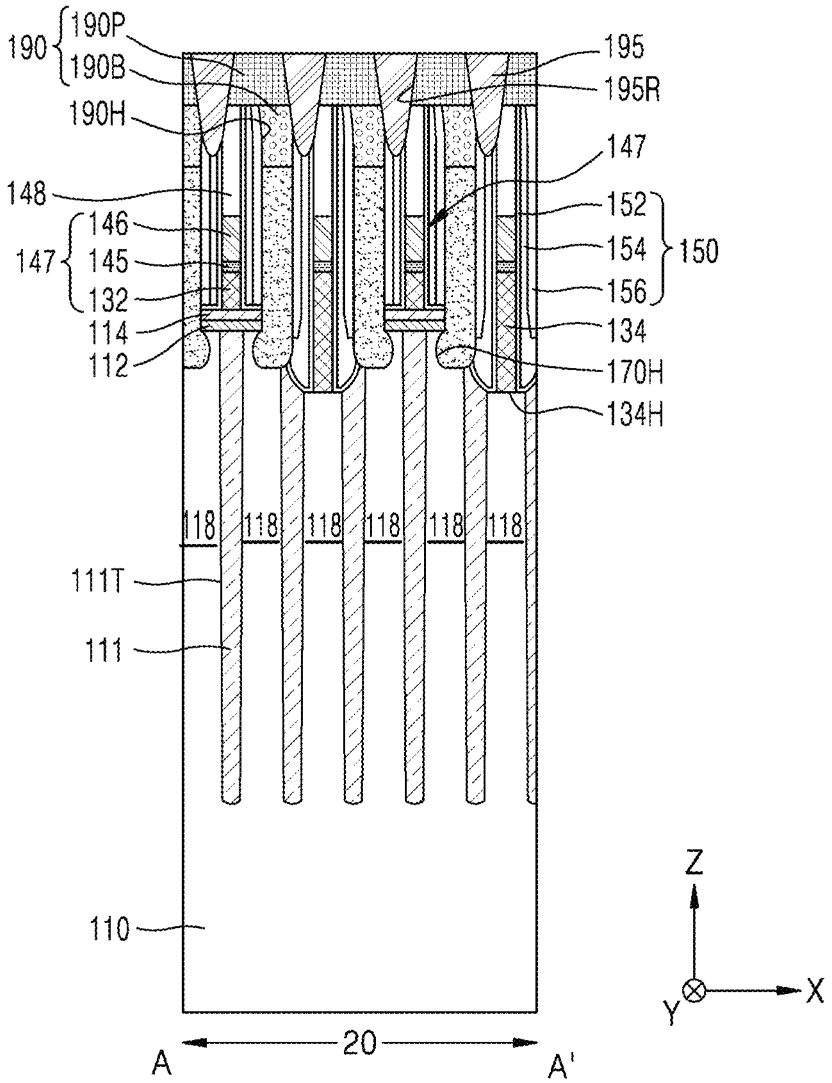
Figure 18B:
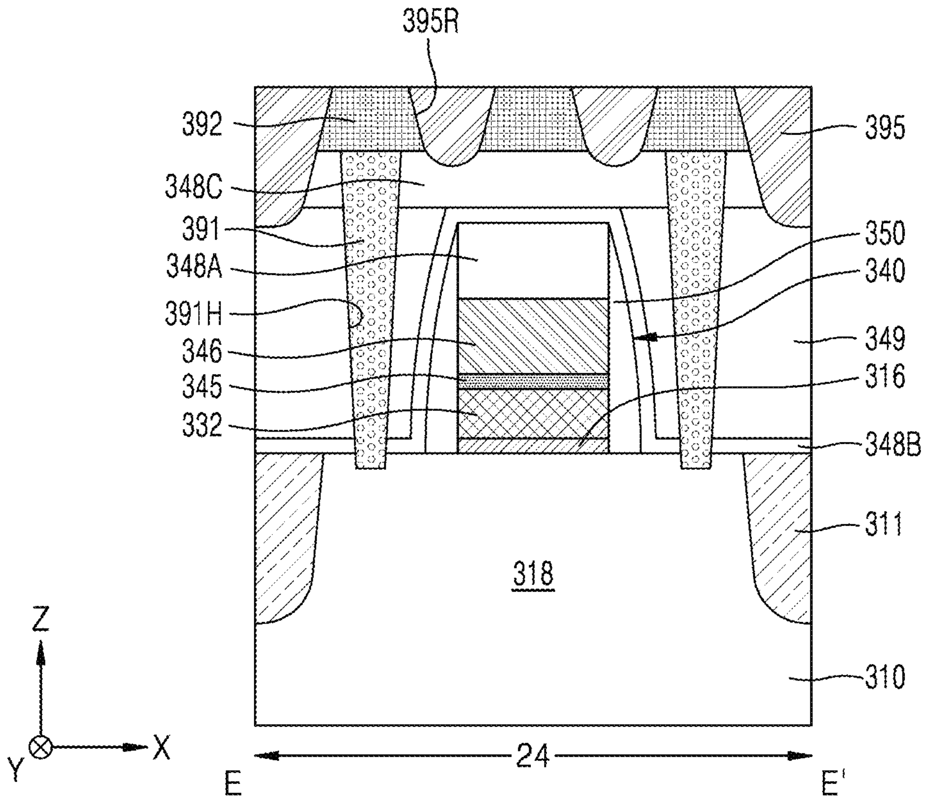

In FIGS. 18A and 18B, the first metal layer 190L and the second metal layer 392L respectively in the cell region 20 and the peripheral circuit region 24 may be etched to form a pad portion 190P of the landing pad 190 and a wiring pad 392. Specifically, by forming a first recess portion 195R by etching the first metal layer 190L on the cell region 20, the pad portion 190P of the landing pad 190 may be formed. As a vertical level of the first recess portion 195R lowers, a width of the first recess portion 195R in the first horizontal direction (the X direction) decreases. Accordingly, the pad portion 190P of the landing pad 190 may have a shape of which a width in the first horizontal direction (the X direction) increases as a vertical level of the pad portion 190P lowers. Specifically, by forming a second recess portion 395R by etching the second metal layer 392L in the peripheral circuit region 24, a wiring pad 392 may be formed. As a vertical level of the second recess portion 395R lowers, a width of the second recess portion 395R in the first horizontal direction (the X direction) decreases. Accordingly, the wiring pad 392 may have a shape of which a width in the first horizontal direction (the X direction) increases as a vertical level of the wiring pad 392 lowers.

In some implementations, processes of forming the pad portion 190P of the landing pad 190 and the wiring pad 392 by forming the first recess portion 195R and the second recess portion 395R may be performed simultaneously. Accordingly, a thickness of the pad portion 190P of the landing pad 190 in the vertical direction (the Z direction) may be equal to a thickness of the wiring pad 392 in the vertical direction (the Z direction).

Next, a first insulating structure 195 may be formed by filling the first recess portion 195R with an insulating material, and a second insulating structure 395 may be formed by filling the second recess portion 395R with an insulating material. In some implementations, a process of forming the first insulating structure 195 and the second insulating structure 395 may include a process of filling the first recess portion 195R and the second recess portion 395R, coating upper surfaces of the pad portion 190P of the landing pad 190 and the wiring pad 392 with an insulating material, and then removing the insulating material on the upper surfaces of the pad portion 190P of the landing pad 190 and the wiring pad 392. Accordingly, the upper surface of the pad portion 190P of the landing pad 190 may be at the same vertical level as an upper surface of the first insulating structure 195. Accordingly, the upper surface of the wiring pad 392 may be at the same vertical level as an upper surface of the second insulating structure 395. In some implementations, a process of forming the first insulating structure 195 and a process of forming the second insulating structure 395 may be performed simultaneously.

Figure 19A:
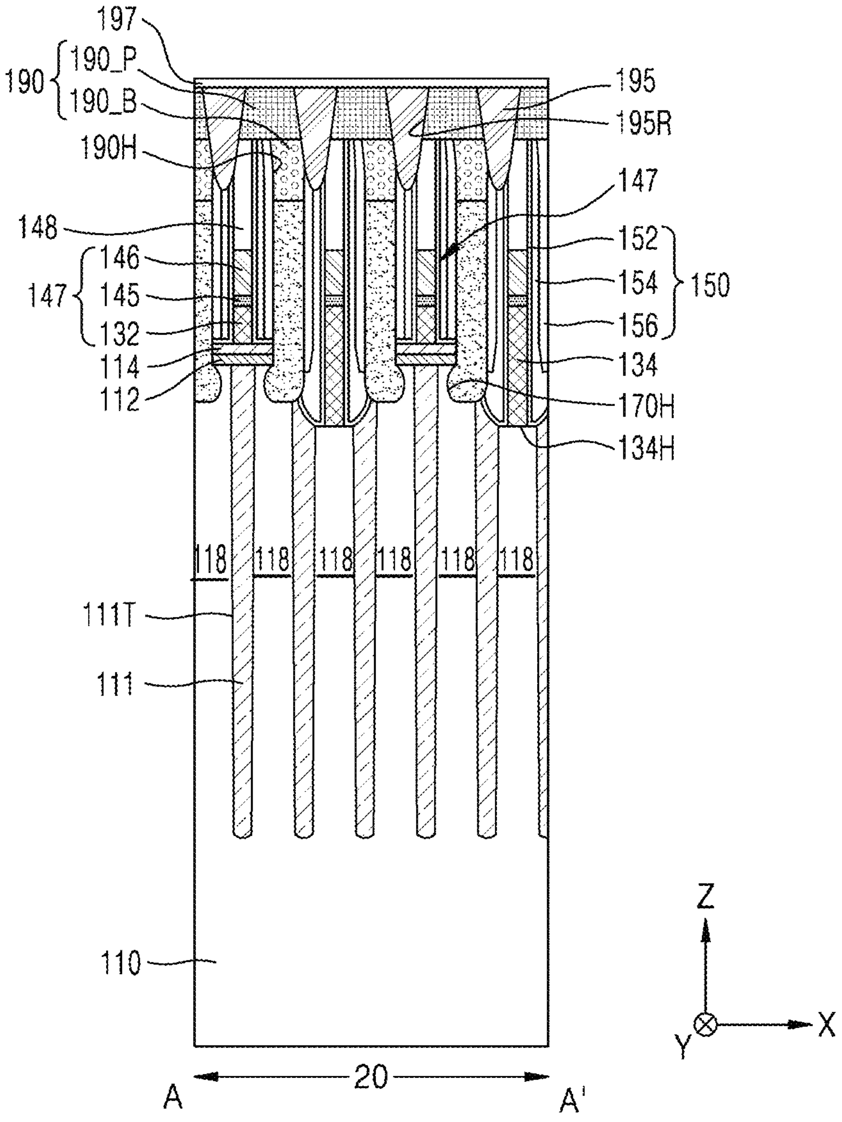
Figure 19B:
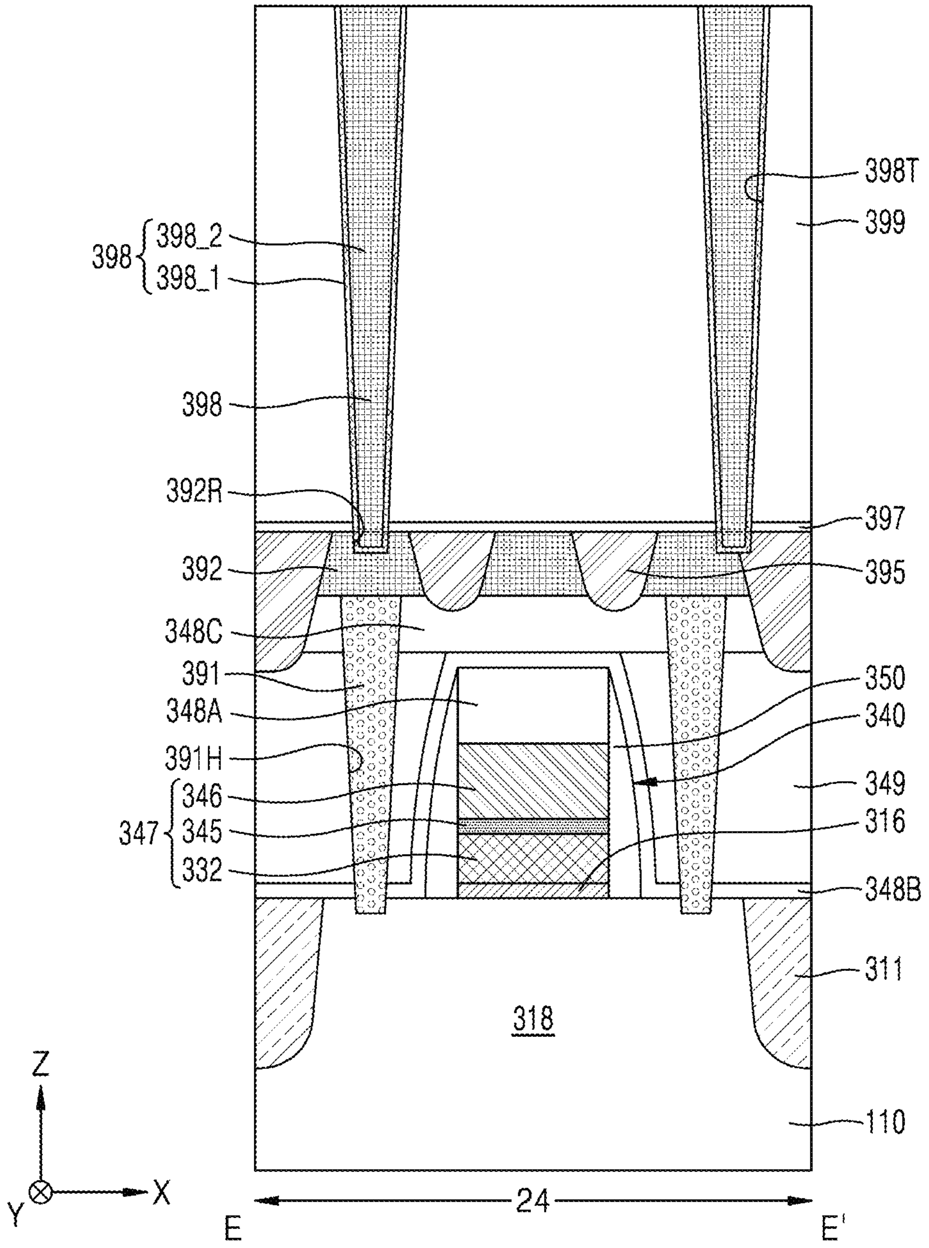

In FIGS. 19A and 19B, a first upper insulating layer 197 and a second upper insulating layer 397 may be respectively formed in the cell region 20 and the peripheral circuit region 24. In some implementations, a process of forming the first upper insulating layer 197 and a process of forming the second upper insulating layer 397 may be performed simultaneously. The first upper insulating layer 197 and the second upper insulating layer 397 may each include silicon carbonitride. For example, a thickness of the first upper insulating layer 197 in the vertical direction (the Z direction) may be equal to a thickness of the second upper insulating layer 397 in the vertical direction (the Z direction).

Subsequently, in the peripheral circuit region 24, a second interlayer insulating layer 399 may be formed on the second upper insulating layer 397, and a recess portion 392R and a metal via trench 398T may be formed on an upper surface of the wiring pad 392 by partially etching the second interlayer insulating layer 399, the second upper insulating layer 397, and the wiring pad 392. Next, a metal via 398 may be formed by sequentially forming a conductive barrier pattern 398_1 and a conductive layer 398_2 in the recess portion 392R and the metal via trench 398T.

In some implementations, when the metal via 398 and the wiring pad 392 are offset from each other (see FIG. 5), the second insulating structure 395 may also be etched together with a part of the second interlayer insulating layer 399, a part of the second upper insulating layer 397, and a part of the wiring pad 392.

While this disclosure contains many specific implementation details, these should not be construed as limitations on the scope of what may be claimed. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially be claimed as such, one or more features from a combination can in some cases be excised from the combination, and the combination may be directed to a subcombination or variation of a subcombination.

What is claimed is:

1. A semiconductor device comprising:

a substrate including a cell region and a peripheral circuit region;

an active region defined by a device isolation layer in the cell region of the substrate;

a word line that, in the cell region of the substrate, extends in a first horizontal direction across the active region;

a bit line that, in the cell region of the substrate, extends in a second horizontal direction to intersect the first horizontal direction;

a peripheral circuit gate line that extends in the second horizontal direction in the peripheral circuit region of the substrate;

an interlayer insulating layer that surrounds the peripheral circuit gate line on the substrate;

a contact plug that is separated in the first horizontal direction from the peripheral circuit gate line on the peripheral circuit region of the substrate and passes into the interlayer insulating layer and is connected to the substrate;

a wiring pad on and in contact with the contact plug, the wiring pad including a recess portion at an upper surface thereof; and a metal via that includes a protrusion within the recess portion and an extension portion on the protrusion, the metal via being in contact with the wiring pad, wherein a first sidewall and a second sidewall of the contact plug are opposite to each other and form acute angles with an upper surface of the contact plug, wherein a first sidewall and a second sidewall of the wiring pad are opposite to each other and form acute angles with a lower surface of the wiring pad, and wherein a width of the protrusion of the metal via in the first horizontal direction is smaller than a width of the extension portion in the first horizontal direction.

2. The semiconductor device of claim 1, wherein the contact plug includes titanium nitride that fills a contact plug hole.

3. The semiconductor device of claim 1, wherein the wiring pad includes material that is different from material of the contact plug.

4. The semiconductor device of claim 1, further comprising an insulating structure on the second sidewall of the wiring pad, wherein the insulating structure has an upper surface at a same vertical level as the upper surface of the wiring pad, and a sidewall of the insulating structure forms an acute angle with the upper surface of the insulating structure.

5. The semiconductor device of claim 1, further comprising:

an insulating structure on the second sidewall of the wiring pad; and an upper insulating layer on the wiring pad and the insulating structure, wherein the metal via passes into the upper insulating layer and contacts the wiring pad, and wherein the upper insulating layer includes material that is different from material of the insulating structure.

6. The semiconductor device of claim 5, wherein the insulating structure includes silicon nitride, and wherein the upper insulating layer includes silicon carbonitride.

7. The semiconductor device of claim 1, wherein the first sidewall and the second sidewall of the wiring pad each form an angle of 85.6° or less with the lower surface of the wiring pad.

8. The semiconductor device of claim 1, wherein a length of the metal via in a vertical direction is 10 μm or greater.

9. The semiconductor device of claim 1, wherein a width of an upper surface of the protrusion of the metal via in the first horizontal direction is smaller than a width of a lower surface of the extension portion in the first horizontal direction.

10. A semiconductor device comprising:

a substrate including a cell region and a peripheral circuit region;

an active region defined by a device isolation layer in the cell region of the substrate;

a word line that, in the cell region of the substrate, extends in a first horizontal direction across the active region;

a plurality of bit line structures that, in the cell region of the substrate, each extend in a second horizontal direction intersecting the first horizontal direction;

a buried contact between the plurality of bit line structures and connected to the active region;

a landing pad arranged on the buried contact, the land pad includes a body portion between the plurality of bit line structures and a pad portion on the body portion, the landing pad being connected to the active region through the buried contact;

a peripheral circuit gate line that extends in the second horizontal direction on the peripheral circuit region of the substrate;

an interlayer insulating layer that surrounds the peripheral circuit gate line on the peripheral circuit region of the substrate;

a contact plug that is separated in the first horizontal direction from the peripheral circuit gate line on the peripheral circuit region of the substrate, the contact plug passes into the interlayer insulating layer to be connected to the substrate;

a wiring pad on and in contact with the contact plug; and a metal via on and in contact with the wiring pad, wherein a width of the contact plug in the first horizontal direction decreases in a downward direction, wherein the wiring pad has a trapezoidal cross-section that includes an upper surface and a lower surface parallel to each other, a first sidewall forming a first angle, which is an acute angle, with the lower surface, and a second sidewall forming a second angle, which is an acute angle, with the lower surface, wherein the metal via includes a portion having a width in the first horizontal direction that decreases as a vertical level of the metal via lowers, and wherein a thickness of the pad portion of the landing pad in a vertical direction is equal to a thickness of the wiring pad in the vertical direction.

11. The semiconductor device of claim 10, wherein the body portion and the pad portion of the landing pad include different material from each other, and wherein the pad portion of the landing pad includes material identical to material of the wiring pad.

12. The semiconductor device of claim 11, wherein the body portion of the landing pad includes titanium nitride, and wherein the pad portion of the landing pad and the wiring pad each include tungsten (W).

13. The semiconductor device of claim 10, wherein the pad portion of the landing pad has a first sidewall and a second sidewall opposite to the first sidewall, and wherein the first sidewall forms a third angle with a lower surface of the pad portion, the third angle being an acute angle, and wherein the second sidewall forms a fourth angle with the lower surface of the pad portion, the fourth angle being an acute angle.

14. The semiconductor device of claim 13, wherein the first angle is less than or equal to the third angle, and wherein the second angle is less than or equal to the fourth angle.

15. The semiconductor device of claim 10, further comprising:

a first insulating structure on a sidewall of the pad portion of the landing pad; and a second insulating structure on the second sidewall of the wiring pad, wherein an upper surface of the pad portion of the landing pad is at a same vertical level as an upper surface of the first insulating structure, wherein an upper surface of the wiring pad is at a same vertical level as an upper surface of the second insulating structure, and wherein a width of each of the first insulating structure and the second insulating structure in the first horizontal direction decreases in a downward direction.

16. The semiconductor device of claim 10, wherein the wiring pad includes a recess portion in the upper surface, and wherein the metal via extends into the recess portion.

17. The semiconductor device of claim 10, wherein a first sidewall of the metal via is in contact with the upper surface of the wiring pad, and wherein a second sidewall of the metal via is spaced apart from the upper surface of the wiring pad.

18. A semiconductor device comprising:

a substrate including a cell region and a peripheral circuit region;

an active region defined by a device isolation layer in the cell region of the substrate;

a word line that, in the cell region of the substrate, extends in a first horizontal direction across the active region;

a plurality of bit line structures that, in the cell region of the substrate, each extend in a second horizontal direction intersecting the first horizontal direction;

a buried contact between the plurality of bit line structures and connected to the active region;

a landing pad arranged on the buried contact, the landing pad includes a body portion between the plurality of bit line structures and a pad portion on the body portion, the landing pad being connected to the active region through the buried contact;

a peripheral circuit gate line that extends in the second horizontal direction on the peripheral circuit region of the substrate;

an interlayer insulating layer that surrounds the peripheral circuit gate line, on the substrate;

a contact plug that is separated in the first horizontal direction from the peripheral circuit gate line in the peripheral circuit region of the substrate, the contact plug includes titanium nitride that fills a contact plug hole that passes into the interlayer insulating layer, and the contact plug is connected to the substrate;

a wiring pad on and in contact with the contact plug, the wiring pad including material different from material of the contact plug, and the wiring pad including a recess portion in an upper surface of the wiring pad;

an upper insulating layer on the wiring pad; and a metal via that extends through the upper insulating layer into the recess portion, the metal via being in contact with the wiring pad, wherein a first sidewall and a second sidewall of the pad portion of the landing pad, which are opposite to each other, form acute angles with a lower surface of the pad portion, wherein a first sidewall and a second sidewall of the contact plug, which are opposite to each other, form acute angles with an upper surface of the contact plug, wherein a first sidewall and a second sidewall of the wiring pad, which are opposite to each other, form acute angles with a lower surface of the wiring pad, wherein a width of the metal via in the first horizontal direction decreases as a vertical level of the metal via lowers, wherein a thickness of the pad portion of the landing pad in a vertical direction is equal to a thickness of the wiring pad in the vertical direction, and wherein a length of the metal via in the vertical direction is 10 μm or greater.

19. The semiconductor device of claim 18, further comprising:

a first insulating structure on a sidewall of the pad portion of the landing pad; and a second insulating structure on the second sidewall of the wiring pad, wherein a width of each of the first insulating structure and the second insulating structure in the first horizontal direction decreases in a downward direction, and the upper insulating layer includes material that is different from material of the first insulating structure and the second insulating structure.

20. The semiconductor device of claim 19, wherein the first insulating structure and the second insulating structure each include silicon nitride, and wherein the upper insulating layer includes silicon carbonitride.

* * * * *